(12) United States Patent
Shinhara

(10) Patent No.: US 8,558,298 B2
(45) Date of Patent: Oct. 15, 2013

(54) SEMICONDUCTOR DEVICE AND METHOD OF FORMING THE SAME

(75) Inventor: Takashi Shinhara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/432,614

(22) Filed: Mar. 28, 2012

(65) Prior Publication Data
US 2012/0248519 A1    Oct. 4, 2012

(30) Foreign Application Priority Data

Mar. 31, 2011   (JP) .................................. 2011-077085

(51) Int. Cl.
*H01L 27/108*  (2006.01)

(52) U.S. Cl.
USPC ............................ 257/296; 257/298; 257/302

(58) Field of Classification Search
USPC .......................................... 257/296, 298, 302
See application file for complete search history.

(56) References Cited

U.S. PATENT DOCUMENTS 6,191,463 B1 *  2/2001  Mitani et al. .................. 257/411
7,936,026 B2 *  5/2011  Taketani ........................ 257/411

FOREIGN PATENT DOCUMENTS

JP    11-317500    11/1999
JP    2001-210801   8/2001

* cited by examiner

*Primary Examiner* — David Vu
*Assistant Examiner* — Brandon Fox
(74) *Attorney, Agent, or Firm* — Young & Thompson

(57) ABSTRACT

A semiconductor device includes a semiconductor substrate having a groove; a gate insulator; a first diffusion region; a gate electrode; a hydrogen-containing insulator; and a fluorine-containing insulator. The gate insulator covers inside surfaces of the groove. The first diffusion region is formed in the substrate. The first diffusion region has a first contact surface that contacts the gate insulator. The gate electrode is formed on the gate insulator and in the groove. The hydrogen-containing insulator is formed over the gate electrode and in the groove. The hydrogen-containing insulator is adjacent to the gate insulator. The fluorine-containing insulator is formed on the hydrogen-containing insulator and in the groove. The first contact surface includes Si—H bonds and Si—F bonds.

20 Claims, 10 Drawing Sheets

US 8,558,298 B2

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2011-077085, filed Mar. 31, 2011, the content of which is incorporated herein by reference.

2. Description of the Related Art

As a semiconductor device disclosed in Japanese Patent Application Publication No. JPA 2001-210801, a DRAM (dynamic random-access memory) has an MOS (metal oxide semiconductor) transistor that has a trench formed in a semiconductor substrate, a gate insulating film formed in the trench, a gate electrode (buried gate electrode) provided in the trench, an insulating film (for example, a silicon oxide film) that buries a depression (part of the above-noted trench) formed in the top of the gate electrode so as to reach the surface of the semiconductor substrate, a first impurity diffusion region (drain region) formed in the semiconductor substrate positioned at one side of the trench, and a second impurity diffusion region (source region) formed in the semiconductor substrate positioned at the other side of the trench.

In the case of a DRAM constituted as noted above, the constitution is such that, the bottom surface of the source/drain diffusion layer formed in the surface of the semiconductor substrate, that is, the junction is in contact with the gate insulating film at a side wall part of the trench.

Therefore, if the interface state at the interface between the gate insulating film and the semiconductor substrate (silicon substrate) is high (or, stated differently, if there are many defects due to dangling bonds of single-crystal silicon at the surface of the semiconductor substrate making contact with the gate insulating film) there is a problem of a leakage current occurring via a defect in a part making contact with the above-noted source/drain diffusion layer junction.

In particular, in a DRAM, the electrical charge stored in a capacitive element connected to the drain diffusion layer leaks as a leakage current. These phenomena can give influences to the refresh characteristics.

In Japanese Patent Application Publication No. JPA 11 (2000)-317500, the hydrogen annealing after the formation of multi-level interconnects can be carried out for reducing the above-noted junction leakage current.

SUMMARY

In one embodiment, a semiconductor device may include, but is not limited to, a semiconductor substrate having a groove; a gate insulator; a first diffusion region; a gate electrode; a hydrogen-containing insulator; and a fluorine-containing insulator. The gate insulator covers inside surfaces of the groove. The first diffusion region is formed in the substrate. The first diffusion region has a first contact surface that contacts the gate insulator. The gate electrode is formed on the gate insulator and in the groove. The hydrogen-containing insulator is formed over the gate electrode and in the groove. The hydrogen-containing insulator is adjacent to the gate insulator. The fluorine-containing insulator is formed on the hydrogen-containing insulator and in the groove. The first contact surface includes Si—H bonds and Si—F bonds.

In another embodiment, a semiconductor device may include, but is not limited to, an insulator; a silicon region; a hydrogen-containing insulator; and a fluorine-containing insulator. The silicon region has a contact surface that contacts the insulator. The hydrogen-containing insulator is adjacent to the insulator. The hydrogen-containing insulator is disposed in an opposite side of the insulator to the silicon region. The fluorine-containing insulator is adjacent to the hydrogen-containing insulator. The fluorine-containing insulator is disposed in an opposite side of the hydrogen-containing insulator to the insulator. The contact surface includes Si—H bonds and Si—F bonds.

In still another embodiment, a semiconductor device may include, but is not limited to, a silicon substrate; a gate insulator; a first diffusion region; a second diffusion region; a gate electrode; a hydrogen-containing insulator; and a fluorine-containing insulator. The silicon substrate has a groove. The semiconductor device includes an active region and an isolation region which defines the active region. The groove extends across the isolation region. The gate insulator covers bottom and side surfaces of the groove. The first diffusion region is formed in the silicon substrate. The first diffusion region has a first contact surface that contacts the gate insulator. The second diffusion region is formed in the silicon substrate. The second diffusion region is positioned in an opposite side of the groove to the first diffusion region. The second diffusion region has a second contact surface that contacts the gate insulator. The gate electrode is formed on the gate insulator and in the groove. The hydrogen-containing insulator is formed over the gate electrode and in the groove. The hydrogen-containing insulator extends along the gate insulator that covers the side surfaces. The fluorine-containing insulator is formed on the hydrogen-containing insulator and in the groove. Each of the first and second contact surfaces includes Si—H bonds and Si—F bonds.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
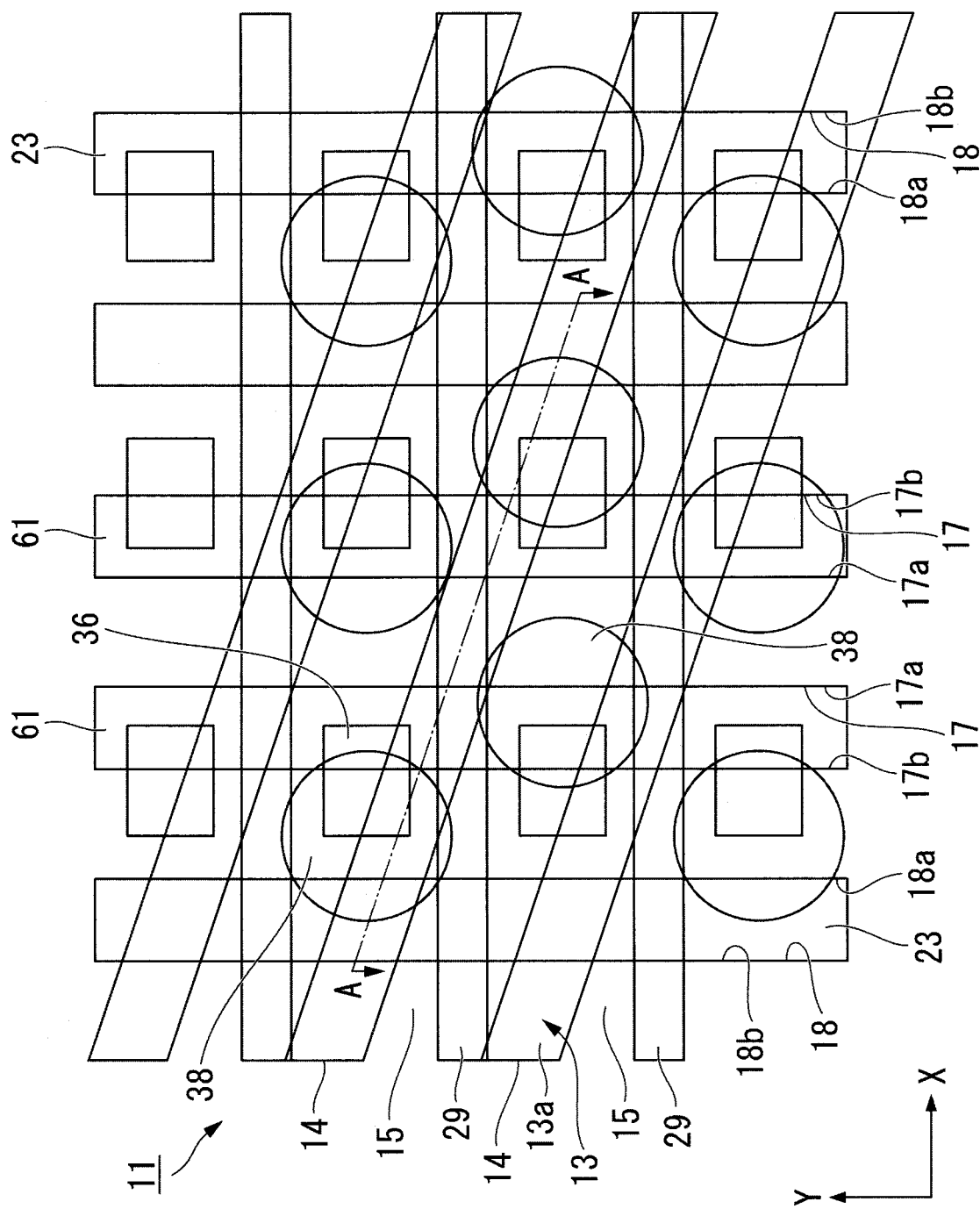
FIG. 1 is a fragmentary plan view of a memory cell array in a semiconductor device in accordance with one or more embodiments of the present invention.

Before describing the present invention, the related art will be explained, in order to facilitate the understanding of the present invention.

The hydrogen annealing noted in Japanese Patent Application Publication No. JPA 11 (2000)-317500 should be done at the end of the manufacturing process. Hydrogen was diffused from the upper surface of a structure that is at a distance above the surface of the semiconductor substrate in the condition after transistors. A plurality of interconnect layers, and interlayer insulating films and the like have already been formed on the semiconductor substrate.

For this reason, the distance between the hydrogen atmosphere and the gate insulating film become long, and this made it difficult to supply a sufficient amount of hydrogen to the boundary between the gate insulating film and the semiconductor substrate. Also, in order to meet the demands for highly precise etching to achieve nanoscaling of semiconductor devices in recent years, a silicon nitride film that acts as a bather to hydrogen diffusion as an etching stopper has come into use as a part of an interlayer insulating film, and this constitution as well is the cause of inhibition of the diffusion of hydrogen to the above-noted boundary.

Because of the above, because it becomes difficult to sufficiently terminate by hydrogen the defects existing in the semiconductor substrate making contact with the gate insulating film, there was a problem of not being able to sufficiently reduce the junction leakage current and a problem of the deterioration MOS transistor characteristics.

Also, in a DRAM, in the case in which the above-noted junction leakage current has increased, the refresh characteristics worsen.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate having a groove; a gate insulator; a first diffusion region; a gate electrode; a hydrogen-containing insulator; and a fluorine-containing insulator. The gate insulator covers inside surfaces of the groove. The first diffusion region is formed in the substrate. The first diffusion region has a first contact surface that contacts the gate insulator. The gate electrode is formed on the gate insulator and in the groove. The hydrogen-containing insulator is formed over the gate electrode and in the groove. The hydrogen-containing insulator is adjacent to the gate insulator. The fluorine-containing insulator is formed on the hydrogen-containing insulator and in the groove. The first contact surface includes Si—H bonds and Si—F bonds.

In some cases, the semiconductor substrate may include, but is not limited to, a silicon substrate.

In some cases, the hydrogen-containing insulator may include, but is not limited to, a hydrogen-containing plasma silicon nitride film.

In some cases, the fluorine-containing insulator may include, but is not limited to, a fluorine-containing silicon oxide film.

In some cases, the gate electrode may include, but is not limited to, a first metal film as a barrier metal that contacts the gate insulator; and a second metal film on the first metal film, the second metal film being lower in resistivity than the first metal film.

In some cases, the semiconductor substrate may include an active region and an isolation region which defines the active region, and the groove extends across the isolation region.

In some cases, the semiconductor device may include, but is not limited to, a bit line coupled to the first diffusion region.

In some cases, the semiconductor device may include, but is not limited to, a second diffusion region in the substrate. The second diffusion region has a second contact surface that contacts the gate insulator. The second diffusion region is placed in an opposite side of the groove to the first diffusion region. The second contact surface includes Si—H bonds and Si—F bonds.

In some cases, the semiconductor device may further include, but is not limited to, a contact plug coupled to the second diffusion region; and a capacitor coupled to the contact plug.

In some cases, the semiconductor device may further include, but is not limited to, a capacitive contact pad on an upper surface of the contact plug. The capacitor is disposed on the capacitive contact pad.

In some cases, the semiconductor device may further include, but is not limited to, an inter-layer insulator in which the capacitor is provided; and a multi-layered insulator over the inter-layer insulator. The multi-layered insulator may include, but is not limited to, a silicon nitride film formed by a thermal chemical vapor deposition method.

In another embodiment, a semiconductor device may include, but is not limited to, an insulator; a silicon region; a hydrogen-containing insulator; and a fluorine-containing insulator. The silicon region has a contact surface that contacts the insulator. The hydrogen-containing insulator is adjacent to the insulator. The hydrogen-containing insulator is disposed in an opposite side of the insulator to the silicon region. The fluorine-containing insulator is adjacent to the hydrogen-containing insulator. The fluorine-containing insulator is disposed in an opposite side of the hydrogen-containing insulator to the insulator. The contact surface includes Si—H bonds and Si—F bonds.

In some cases, the hydrogen-containing insulator may include, but is not limited to, a hydrogen-containing plasma silicon nitride film.

In some cases, the fluorine-containing insulator may include, but is not limited to, a fluorine-containing silicon oxide film.

In some cases, the insulator may include at least one of silicon oxide, silicon nitride and silicon oxynitride.

In still another embodiment, a semiconductor device may include, but is not limited to, a silicon substrate; a gate insulator; a first diffusion region; a second diffusion region; a gate electrode; a hydrogen-containing insulator; and a fluorine-containing insulator. The silicon substrate has a groove. The semiconductor device includes an active region and an isolation region which defines the active region. The groove extends across the isolation region. The gate insulator covers bottom and side surfaces of the groove. The first diffusion region is formed in the silicon substrate. The first diffusion region has a first contact surface that contacts the gate insulator. The second diffusion region is formed in the silicon substrate. The second diffusion region is positioned in an opposite side of the groove to the first diffusion region. The second diffusion region has a second contact surface that contacts the gate insulator. The gate electrode is formed on the gate insulator and in the groove. The hydrogen-containing insulator is formed over the gate electrode and in the groove. The hydrogen-containing insulator extends along the gate insulator that covers the side surfaces. The fluorine-containing insulator is formed on the hydrogen-containing insulator and in the groove. Each of the first and second contact surfaces includes Si—H bonds and Si—F bonds.

In some cases, the semiconductor device may further include, but is not limited to, a bit line coupled to the first diffusion region.

In some cases, the semiconductor device may further include, but is not limited to, a contact plug coupled to the second diffusion region; and a capacitor coupled to the contact plug.

In some cases, the semiconductor device may further include, but is not limited to, a capacitive contact pad on an upper surface of the contact plug, the capacitor being disposed on the capacitive contact pad.

In some cases, the semiconductor device may further include, but is not limited to, an inter-layer insulator in which the capacitor is provided; and a multi-layered insulator over the inter-layer insulator. The multi-layered insulator may include, but is not limited to, a silicon nitride film formed by a thermal chemical vapor deposition method.

According to the semiconductor device of the one or more embodiments, by having a gate insulating film that is disposed above a gate electrode, a hydrogen-containing insulating film covering the upper surface of the gate electrode, and a fluorine-containing insulating film burying the top part of a gate electrode trench with the hydrogen-containing insulating film interposed therebetween, and having, on surfaces of first and second impurity diffusion regions making contact with the gate insulating film, an Si—H bond between silicon contained in the semiconductor substrate and hydrogen contained in the hydrogen-containing insulating film, and an Si—F bond between silicon contained in the semiconductor substrate and fluorine contained in the fluorine-containing insulating film, because it is possible to terminate defects existing at the surfaces of the first and second impurity diffusion regions making contact with the gate insulating film, it is possible to reduce the junction leakage current. Also, for example, when using a DRAM as the semiconductor device, it is possible to improve the refresh characteristics.

By providing, on surfaces of the first and second impurity diffusion regions making contact with the gate insulating film, a Si—F bond, which has a bonding energy that is high compared with that of a Si—H bond and that resists dissociation with heat, in a back-end process step after the manufacture of a semiconductor device (specifically, for example, a dicing process step, a die-bonding process step, a wire-bonding process step, a semiconductor device resin sealing process step, or a lead processing step), because it is possible to suppress the PBTI (positive bias temperature instability) and NBTI (negative bias temperature instability) failure modes and suppress HC deterioration, it is possible to improve the reliability of transistors provided in the semiconductor device.

[Embodiments]

Embodiments to which the present invention is applied will be described below, with references made to the drawings. The drawings used in the following descriptions are for the purpose of describing the constitution of the embodiments of the present invention, and the sizes, thicknesses, dimensions, and the like of various parts shown therein may be different that the dimensional relationships in an actual semiconductor device.

Figure 2:
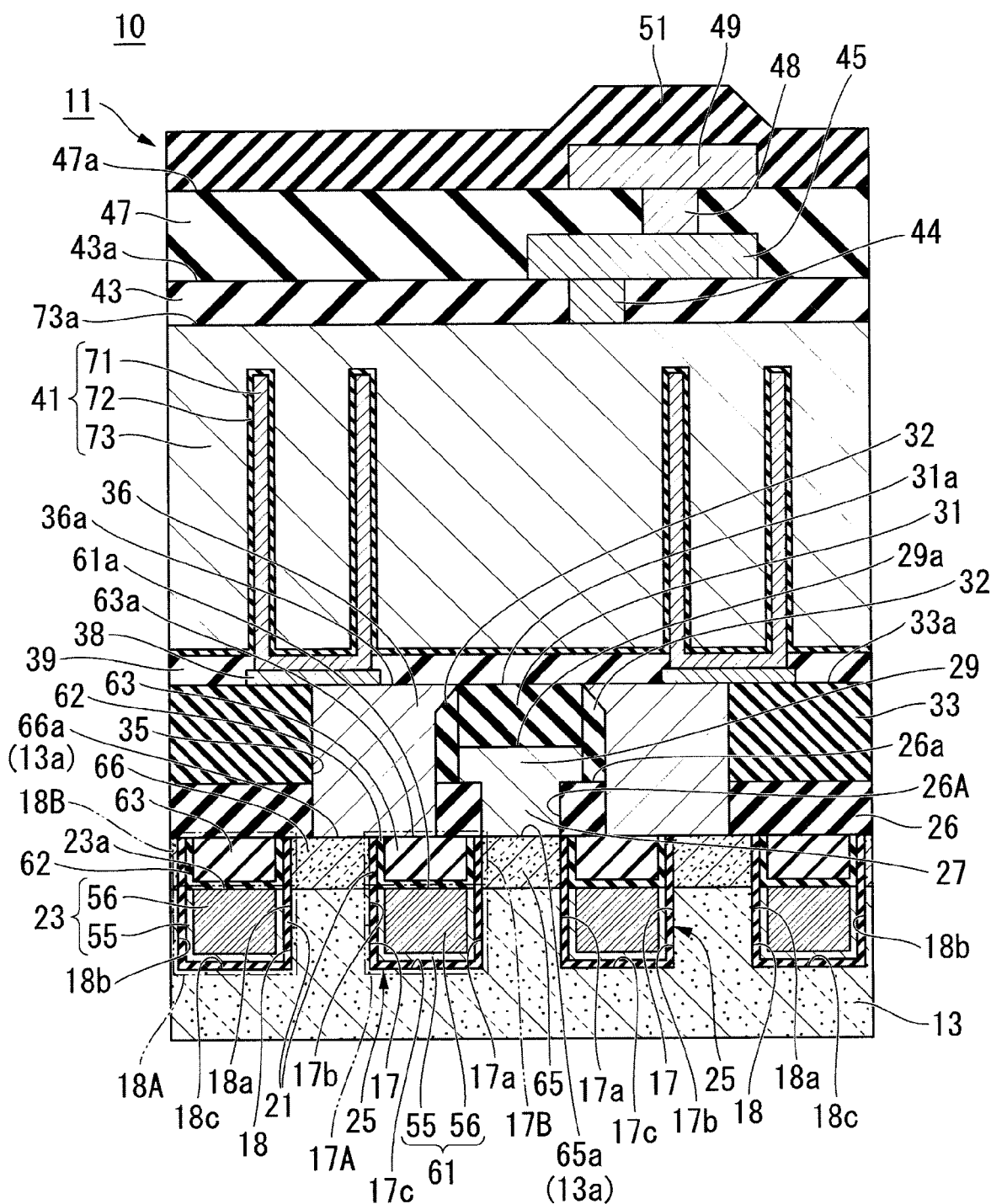
FIG. 2 is a fragmentary cross sectional elevation view, taken along an A-A line of FIG. 1.

FIG. 1 is a plan view of a memory cell in a semiconductor device according to an embodiment of the present invention, and FIG. 2 is a cross-sectional view of the semiconductor device shown in FIG. 1 along the line A-A.

In FIG. 1, a DRAM (dynamic random-access memory) is given as an example of a semiconductor device 10 of the present embodiment. FIG. 1 illustrates an example of the layout of the memory cell 11 in a DRAM.

In FIG. 1, the X direction shows the second direction (direction of extension of the bit lines 29) and the Y direction shows the first direction (direction of extension of the gate electrode trenches 17), which intersects with the X direction.

In FIG. 1, as a convenience in this description, only a semiconductor substrate 13, an active region 14, an element separation region 15, a gate electrode trench 17, a dummy gate electrode trench 18, a dummy gate electrode 23, a silicon layer 21, a silicon layer 22 (other silicon layer), a bit line 29, a contact plug 36, and a capacitor contact pad 38 are shown, with constituent elements of the memory cell 11 omitted from the drawing. In FIG. 2 constituent parts that are the same as those in the semiconductor device 10 shown in FIG. 1 are assigned the same reference symbols.

The semiconductor device 10 according to the present embodiment has a memory cell region in which the memory cell 11 shown in FIG. 1 and FIG. 2 is disposed and a peripheral circuit region (not shown) disposed in the periphery of the memory cell region, in which a transistor (not shown) for a peripheral circuit is disposed.

At this point, the constitution of the memory cell 11 provided in the semiconductor device 10 of the present embodiment will be described, with reference made to FIG. 1 and FIG. 2.

Referring to FIG. 1 and FIG. 2, the memory cell 11 has a semiconductor substrate 13, a element separation region 15, a gate electrode trench 17, a dummy gate electrode trench 18, a gate insulating film 21, a dummy gate electrode 23, a transistor 25, a first interlayer insulating film 26, a bit contact 27, a side wall film 32, a bit line 29, a capacitor insulating film 31, a second interlayer insulating film 33, a contact hole 35, a contact plug 36, a capacitor contact pad 38, a silicon nitride film 39, a capacitor 41, a third interlayer insulating film 43, vias 44, 48, interconnects 45, 49, a fourth interlayer insulating film 47, and a protective film 51.

In the present embodiment, the interlayer insulating film recited in claims 8 and 9 is constituted by the first interlayer insulating film 26 and the second interlayer insulating film 33, and the plurality of laminated insulating films recited in claim 10 are constituted by the silicon nitride film 39, the third interlayer insulating film 43, the fourth interlayer insulating film 47, and the protective film 51.

Referring to FIG. 1, the semiconductor substrate 13 is planar and is a single-crystal semiconductor substrate made of silicon. A plurality of active regions 14 extending as band shapes in a direction that is at a prescribed angle of inclination with respect to the X direction, and surrounded by the element separation regions 15 are formed on the upper surface 13a of the semiconductor substrate 13.

A p-type single-crystal silicon substrate can be used, for example, as the semiconductor substrate 13.

In the present embodiment, the description will be for the case in which a p-type single-crystal silicon substrate is used as the semiconductor substrate 13.

Referring to FIG. 1, the element separation regions 15 are formed on the semiconductor substrate 13, and partition the above-noted plurality of active regions 14. The element separation regions 15 are separated by gate electrode trenches 17. An element separation region 15 is constituted by burying an element separation trench (not shown) formed in the semiconductor substrate 13 by an insulating film (for example, a silicon oxide film ($SiO_2$ film)).

Referring to FIG. 2, a gate electrode trench 17 is formed in the semiconductor substrate 13 so as to extend in the Y direction, and is partitioned by inner surfaces, which include the bottom surface 17c and the opposing first and second side surfaces 17a, 17b opposing thereof (hereinafter, "the inner surface including the bottom surface 17c and opposing first and second side surfaces 17a, 17b of the gate electrode trench 17 being referred to simply as the "inner surface of the gate electrode trench 17"). The width $W_1$ of the gate electrode trench 17 can be made, for example, 45 nm. In this case, the depth $D_1$ of the gate electrode trench 17 can be made, for example, 200 nm Referring to FIG. 1, the two gate electrode trenches 17 are disposed between two dummy gate electrode trenches 18 that extend in the Y direction. The two gate electrode trenches 17 are disposed so that their first side surfaces 17a are in opposition.

Referring to FIG. 2, the dummy gate electrode trench 18 is formed in the semiconductor substrate 13 so as to extend in the Y direction, and is partitioned by inner surfaces, which include the bottom surface 18c and the opposing first and second side surfaces 18a, 18b (hereinafter, "the inner surface including the bottom surface 18c and the opposing side surfaces 18a, 18b of the gate electrode trench 18" being referred to simply as the "inner surface of the dummy gate electrode trench 18"). The width $W_2$ of the dummy gate electrode trench 18 can be made substantially the same as the width $W_1$ of the gate electrode trench 17, for example, 45 nm. Also, the depth $D_2$ of the dummy gate electrode trench 18 can be made substantially the same as the depth $D_1$ of the gate electrode trench 17, for example, 200 nm.

Referring to FIG. 1, the dummy gate electrode trenches 18 are disposed so as to sandwich the two gate electrode trenches 17 extending in the Y direction.

Referring to FIG. 2, the gate insulating film 21 is provided so as to cover the inner surface of the gate electrode trench 17 and the inner surface of the dummy gate electrode trench 18.

As the gate insulating film 21 it is possible to use a laminated film of, for example, a single-layer silicon oxide film ($SiO_2$ film), a nitrided silicon oxide film (SiON film), a laminated silicon oxide film ($SiO_2$ film), or a silicon oxide film ($SiO_2$ film) over which a silicon nitride film (SiN film) is laminated.

In the case of using a single-layer silicon oxide film ($SiO_2$ film) as the gate insulating film 21, the thickness of the gate insulating film 21 can be made, for example, 4 nm.

Referring to FIG. 2, the dummy gate electrode 23 is provided on the bottom part 18A of the dummy gate electrode trench 18, with an intervening gate insulating film 21. The upper surface 23a of the dummy gate electrode 23 is disposed below the upper surface 23a of the semiconductor substrate 13. The depth from the upper surface 13a of the semiconductor substrate 13 to the upper surface 23a of the dummy gate electrode 23 can made, for example, 60 nm.

The dummy gate electrode 23 has a first metal film 55, which is in contact with the gate insulating film 21 and functions as a barrier film, and a second metal film 56 that buries the bottom part 18A of the dummy gate electrode trench 18, with the first metal film 55 intervening therebetween.

As the first metal film 55, it is possible to use, for example, a titanium nitride film (TiN film) having a thickness of 5 nm. As the second metal film 56, it is possible to use, for example, a tungsten film (W film).

Referring to FIG. 2, the transistor 25 is an MOS (metal oxide semiconductor) transistor for selection, having a trench gate structure.

The transistor 25 has a gate insulating film 21 provided on in the inner surface of the gate electrode trench 17, a gate electrode 61, a hydrogen-containing insulating film 62, a fluorine-containing insulating film 63, a first impurity diffusion region 65, and a second impurity diffusion region 66.

Referring to FIG. 2, the gate electrode 61 is provided so as to bury the bottom part 17A of the gate electrode trench 17, with an intervening gate insulating film 21 therebetween. Referring to FIG. 1, the gate electrodes 61 extends the in the Y direction, straddling a plurality of active regions 14 and element separation regions 15. The gate electrode 61 is an electrode that functions as a word line.

Referring to FIG. 2, the upper surface 61a of the gate electrode 61 is disposed below the upper surface 13a of the semiconductor substrate 13. The depth from the upper surface 13a of the semiconductor substrate 13 to the upper surface 61a of the gate electrode 61 can be made, for example, 60 nm.

The gate electrode 61 has a first metal film 55 which is in contact with the gate insulating film 21 and functions as a barrier film, and a second metal film 56 that buries the bottom part 17A of the gate electrode trench 17, with the first metal film 55 intervening therebetween. That is, the gate electrode 61 is constituted by the same metal films (specifically, the first and second metal films 55, 56) as those of the dummy gate electrode 23 previously described.

As the first metal film 55, it is possible to use, for example, a titanium nitride film (TiN film) having a thickness of 5 nm. As the second metal film 56, it is possible to use, for example, a tungsten film (W film).

Referring to FIG. 2, the hydrogen-containing insulating film 62 is provided so as to cover the upper surface 23a of the dummy gate electrode 23, the upper surface 61a of the gate electrode 61, the gate insulating film 21 that is disposed above the upper surface 23a of the dummy gate electrode 23, and the gate insulating film 21 that is disposed above the upper surface 61 of the gate electrode 61.

The hydrogen-containing insulating film 62 is formed with a thickness that does not bury the top part 17B of the gate electrode trench 17 (the part that is positioned above the bottom part 17A of the gate electrode trench 17).

Specifically, in the case in which, with the width $W_1$ of the gate electrode trench 17 as 45 nm and also the depth from the upper surface 13a of the semiconductor substrate 13 to the upper surface 61a of the gate electrode 61 as 60 nm, the thickness of the hydrogen-containing insulating film 62 can be made, for example, 20 nm.

The hydrogen-containing insulating film 62 is an insulating film for the purpose of causing a reaction between silicon (Si) and hydrogen (H) contained in the semiconductor substrate 13 on which the first and second impurity diffusion regions 65, 66 are formed and forming Si—H bonds, being done by a thermal processing step performed after the forming of the hydrogen-containing insulating film 62 (refer to the process shown in FIG. 12, to be described later), so as to cause diffusion of hydrogen (H) contained in the hydrogen-containing insulating film 62 so that it reaches the surfaces of the first and second impurity diffusion regions 65, 66 that are in contact with the gate insulating film 21 (specifically, the first and second side surfaces 17a, 17b that constitute the top part 17B of the gate electrode trench 17). In FIG. 2, the above-noted Si—H bond is provided at surfaces of the first and second impurity diffusion regions 65, 66 that are in contact with the gate insulating film 21 that is not shown.

In this case, the region in which the hydrogen termination occurs is described as the surfaces of the first and second impurity diffusion regions 65, 66 that make contact with the gate insulating film 21. More specifically, there is termination in the entire region of the regions corresponding to the first and second side surfaces 17a, 17b of the gate electrode trench 17 and the region corresponding to the bottom surface 17c thereof.

That is, hydrogen that is contained in the hydrogen-containing insulating film 62 diffuses within the gate insulating film 21 and terminates the unbounded hands of the silicon positioned at the opposing surface of the semiconductor substrate 13.

Because the gate insulating film 21 is formed so as to cover the entire inner surface of the gate electrode trench 17, the entire first and second side surfaces 17a, 17b and the bottom surface 17c are terminated, as noted above.

Therefore, the termination of the surfaces of the first and second impurity diffusion regions 65, 66 means that silicon substrate surface on the entire inner surface of the gate electrode trench 17 is terminated.

By providing Si—H bonds at the surfaces of the first and second impurity diffusion regions 65, 66 in contact with the gate insulating film 21 in this manner, because defects existing at the surfaces of the first and second impurity diffusion regions 65, 66 in contact with the gate insulating film 21 (specifically, damage by dry etching, stress from processing and film deposition, stress, and defects caused by ion implantation) can be terminated, it is possible to reduce the junction leakage current. By doing this, it is possible, in the case of using a DRAM as the semiconductor device 10, to suppress a worsening of the refresh characteristics.

Referring to FIG. 2, the hydrogen-containing insulating film 62 is disposed between the upper surface 61a of the gate electrode 61 and the fluorine-containing insulating film 63.

By providing the hydrogen-containing insulating film 62 between the upper surface 61a of the gate electrode 61 and the fluorine-containing insulating film 63 in this manner, direct contact between the fluorine-containing insulating film 63 that contains fluorine (F) and the gate electrode 23 that is constituted by the first and second metal films 55, 56 is eliminated. By doing this, the fluorine contained in the fluorine-containing insulating film 63 enables suppression of the corrosion of the gate electrode 61 that is made of the first and second metal films 55, 56.

A plasma SiN film in which the hydrogen contained in the hydrogen-containing insulating film 62 is within the range from 0.5 to $2 \times 10^{22}$ atoms/cm$^3$ can be used as the hydrogen-containing insulating film 62. If the hydrogen concentration is lower than $0.5 \times 10^{22}$ atoms/cm$^3$, the termination effect is insufficient, and if it exceeds $2 \times 10^{22}$ atoms/cm$^3$, the hydrogen within the film coheses and becomes a gas, and the application of thermal processing at 400° C. or above is particularly undesirable because it leads to expansion and breakage of the film.

Referring to FIG. 2, the fluorine-containing insulating film 63 is provided so as to bury the top part 17B of the gate electrode trench 17, with the hydrogen-containing insulating film 62 intervening therebetween. A fluorine-containing silicon oxide film (specifically, for example, an SiOF film) can be used as the fluorine-containing insulating film 63. The fluorine contained in the fluorine-containing insulating film 63 should have a concentration in the range, for example, from 0.5 to $1 \times 10^{21}$ atoms/cm$^3$. If the concentration is below this range, the termination effect is insufficient, and if it is excessive there is a risk of the gate electrode being etched.

The fluorine-containing insulating film 63 is an insulating film for the purpose of causing a reaction between the silicon existing at the surfaces of the first and second impurity diffusion regions 65, 65 and fluorine and forming Si—F bonds, this done by a thermal processing step performed after the forming of the fluorine-containing insulating film 63 (refer to the process shown in FIG. 12, to be described later), so as to cause diffusion of fluorine (F) contained in the fluorine-containing insulating film 63 into the surfaces of the first and second impurity diffusion regions 65, 66 in contact with gate insulating film 21 (specifically, the first and second side surfaces 17a, 17b that constitute the top part 17B of the gate electrode trench 17).

By providing Si—F bonds on the surfaces of the first and second impurity diffusion regions 65, 66 in contact with the gate insulating film 21 in this manner, because defects existing at the surfaces of the first and second impurity diffusion regions 65, 66 in contact with the gate insulating film 21 can be terminated, it is possible to reduce the junction leakage current. Therefore, it is possible, in the case of a DRAM as the semiconductor device 10 as in the present embodiment, to suppress a worsening of the refresh characteristics.

The bonding energy of an Si—F bond is higher than that of an Si—H bond (refer to Kang-ill Seo, Raghavasimhan Sreenivasan, Paul C. McIntyre, and Krishna C. Saraswat "Improvement in High-k (HfO/SiO$_2$) Reliability by Incorporation of Fluorine", IEEE 2005).

For this reason, in a back-end process step performed after the manufacture of the semiconductor device 10 (specifically, for example, a dicing process step, a die-bonding process step, a wire-bonding process step, a semiconductor device 10 resin sealing process step, or a lead processing step), when stress or heat is applied to the semiconductor device 10, it is more difficult for an Si—F bond to dissociate than it is for an Si—H bond.

Thus, in the semiconductor device 10 that is back-end processed, because it is possible to suppress the PBTI (positive bias temperature instability) and NBTI (negative bias temperature instability) failure modes and suppress HC deterioration, it is possible to improve the reliability of transistors 25.

Referring to FIG. 2, the first impurity diffusion region 65 is formed on the part of the semiconductor substrate 13 (active region 14) positioned between first side surfaces 17a of two gate electrode trenches 17 formed so as to be adjacent to one another, in the part positioned higher than the upper surface 61a of the gate electrode 61. The upper surface 65a of the first impurity diffusion region 65 is made substantially flush with respect to the upper surface 13a of the semiconductor substrate 13.

The first impurity diffusion region 65 is an impurity diffusion region that functions as a source/drain region. In the case of the structure of the semiconductor device 10 shown in FIG.

2, the first impurity diffusion region 65 functions as a drain region. In the case in which the semiconductor substrate 13 is a p-type silicon substrate, the first impurity diffusion region 65 is formed by ion implantation of an n-type impurity (for example, phosphorus (P)) into the semiconductor substrate 13.

Referring to FIG. 2, the second impurity diffusion region 66 is formed on the part of the semiconductor substrate 13 (active region 14) positioned between the second side surface 17b of the gate electrode trench 17 and the side surface 18a of the dummy gate electrode trench 18 in the part positioned higher than the upper surface 61a of the gate electrode 61. The upper surface 66a of the second impurity diffusion region 66 is made substantially flush with respect to the upper surface 13a of the semiconductor substrate 13.

The second impurity diffusion region 66 is an impurity diffusion region that functions as a source/drain region. In the case of the structure of the semiconductor device 10 shown in FIG. 2, the second impurity diffusion region 66 functions as a source region. In the case in which the semiconductor substrate 13 is a p-type silicon substrate, the second impurity diffusion region 66 is formed by ion implantation of an n-type impurity (for example, phosphorus (P)) into the semiconductor substrate 13.

Referring to FIG. 2, the first interlayer insulating film 26 is provided on the upper-end surface of the gate insulating film 21, the upper-end surface of the hydrogen-containing insulating film 62, the upper surface 63a of the fluorine-containing insulating film 63, and the upper surface 66a of the second impurity diffusion region 66.

The first interlayer insulating film 26 has an aperture part 26A that exposes the upper surface 65a of the first impurity diffusion region 65. A silicon oxide film ($SiO_2$ film) is used as the first interlayer insulating film 26.

Referring to FIG. 2, the bit contact 27 is provided so as to bury the aperture part 26A of the first interlayer insulating film 26. The lower end of the bit contact 27 makes contact with the upper surface 65a of the first impurity diffusion region 65. Because of this, the bit contact 27 is electrically connected to the first impurity diffusion region 65. The bit contact 27 is constituted by a metal film. Specifically, the bit contact 27 can be constituted, for example, by a polysilicon film.

Referring to FIG. 1 and FIG. 2, the bit lines 29 are provided on the upper surface 26a of the first interlayer insulating film 26 so as to extend in the X direction. By doing this, the bit lines 29 intersect with the gate electrodes 61.
The bit lines 29 are constituted so as to be integrally formed with the bit contacts 27. By doing this, the bit lines 29 are electrically connected to the first impurity diffusion regions 65, via the bit contacts 27. The bit lines 29 can be made as a laminated structure, in which, for example, a titanium nitride film and a tungsten film are successively laminated.

Referring to FIG. 2, the capacitor insulating film 31 is provided so as to cover the upper surface 29a of the bit line 29. The capacitor insulating film 31 protects the upper surface 29a of the bit line 29 and also functions as an etching mask when a metal film that is the base material of the bit line 29 is etched using anisotropic etching (specifically, dry etching). The upper surface 31a of the capacitor insulating film 31 is made a flat surface. A silicon nitride film (SiN film) is used as the capacitor insulating film 31.

Referring to FIG. 2, the side wall film 32 is provided on the upper surface 26a of the first interlayer insulating film 26 so as to cover the side surface of the bit line 29 and the side surface of the capacitor insulating film 31. A silicon nitride film (SiN film) is used as the side wall film 32.

Referring to FIG. 2, the second interlayer insulating film 33 is provided on the upper surface 26a of the first interlayer insulating film 26, so as to expose the upper surface 31a of the capacitor insulating film 31. The upper surface 33a of the second interlayer insulating film 33 is made a flat surface, and is made substantially flush with respect to the upper surface 31a of the capacitor insulating film 31. A silicon oxide film ($SiO_2$ film) is used as the second interlayer insulating film 33.

Referring to FIG. 2, the contact hole 35 is provided so as to pass through an interlayer insulating film constituted by the first and second interlayer insulating films 26, 33, and so as to expose a part of the upper surface 66a of the second impurity diffusion region 66 and a part of the upper surface 63a of the fluorine-containing insulating film 63.

Referring to FIG. 2, the contact plug 36 is provided so as to bury the contact hole 35. That is, the contact plug 36 passes through the first and second interlayer insulating films 26, 33 and also reaches the upper surface 63a of the fluorine-containing insulating film 63 and the upper surface 66a of the second impurity diffusion region 66. The upper surface 36a of the contact plug 36 is made a flat surface and is made to be substantially flush with respect to the upper surface 33a of the second interlayer insulating film 33.

Referring to FIG. 2, the capacitor contact pad 38 is provided on the upper surface 33a of the second interlayer insulating film 33, so that a part thereof as to come into contact with the upper surface 36a of the contact plug 36. A lower electrode 71 of the capacitor 41 is provided on the capacitor contact pad 38. By doing this, the capacitor contact pad 38 is electrically connected to the contact plug 36 and the lower electrode 71.

Referring to FIG. 1, the capacitor contact pads 38 are circularly shaped and, in the Y direction, are disposed in zig-zag fashion with respect to contact plugs 36. These capacitor contact pads 38 are disposed, in the X direction, between neighboring bit lines 29.

That is, the capacitor contact pads 38 are disposed, either so that the center part of a capacitor contact pad 38 is disposed above every other gate electrode 61 in the Y direction, or so that the center part of the capacitor contact pad 38 is disposed above the side surface of every other gate electrode 61 in the Y direction, with one of these positions being repeated in a zig-zag arrangement in the Y direction.

Referring to FIG. 2, the silicon nitride film 39 is provided on the upper surface 33a of the second interlayer insulating film 33, so as to surround the outer periphery of the capacitor contact pad 38.

As will be described with regard to the method for manufacturing, because there is a need for the silicon nitride film 39 to function as a stopper with respect to etching of the silicon oxide film, it is necessary to have a densely packed film formed by thermal CVD, which does not use plasma.

The above-noted silicon nitride film 39 is formed with a raw gas of dichlorosilane and ammonia at a temperature range of 650 to 800° C., and with the amount of included hydrogen within the film in the range from 1 to $2\times10^{21}$ atoms/cm³.

As described above, within the above-noted concentration range, the hydrogen does not function as hydrogen to terminate the inner surface of the gate electrode trench 17. On the contrary, because the silicon nitride film 39 that is densely packed functions rather as a diffusion barrier for the hydrogen that is supplied from the gas state in the final hydrogen annealing, it is a factor in inhibiting the diffusion of hydrogen up to the gate insulating film 21.

Referring to FIG. 2, one capacitor 41 is provided with respect to each of the capacitor contact pads 38. The capacitor 41 has a lower electrode 71, a capacitor insulating film 72, and an upper electrode 73.

The lower electrode 71 is provided over the capacitor contact pad 38, and is connected to the capacitor contact pad 38. The lower electrode 71 has the shape of a crown.

The capacitor insulating film 72 is provided so as to continuously cover the surface of a plurality of lower electrodes 71 exposed from the silicon nitride film 39, and the upper surface of the silicon nitride film 39. That is, the capacitor insulating film 72 is disposed so as to pass across a plurality of lower electrodes 71.

The upper electrode 73 is provided so as to cover the surface of the capacitor insulating film 72. The upper electrode 73 is disposed so as to bury the inside of the lower electrode 71 in which the capacitor insulating film 72 is formed, and between a plurality of lower electrodes 71. The upper surface 73a of the upper electrode 73 is disposed higher than the upper end of the plurality of lower electrodes 71, and is also a flat surface.

The capacitor 41 having the constitution noted above is electrically connected to the second impurity diffusion region 66 via the capacitor contact pad 38.

Referring to FIG. 2, the third interlayer insulating film 43 is provided on the upper surface 73a of the upper electrode 73. A silicon oxide film ($SiO_2$ film) is used as the third interlayer insulating film 43.

Referring to FIG. 2, the via 44 is provided inside the third interlayer insulating film 43. The bottom end of the via 44 makes contact with the upper surface 73a of the upper electrode 73. By doing this, the via 44 is electrically connected to the upper electrode 73.

Referring to FIG. 2, the interconnect 45 is disposed on the upper surface 43a of the third interlayer insulating film 43, and is connected to the top end of the via 44. By doing this, the interconnect 45 is electrically connected to the upper electrode 73 of the capacitor 41 through the via 44.

Referring to FIG. 2, the fourth interlayer insulating film 47 is provided on the upper surface 43a of the third interlayer insulating film 43 so as to cover the interconnect 45. A silicon oxide film ($SiO_2$ film) is used as the fourth interlayer insulating film 47.

Referring to FIG. 2, the via 48 is provided inside the fourth interlayer insulating film 47 positioned above the interconnect 45. The top end of the via 48 is exposed from the upper surface 47a of the fourth interlayer insulating film 47, and the bottom end of the via 48 makes contact with the interconnect 45.

Referring to FIG. 2, the interconnect 49 is provided on the upper surface 47a of the fourth interlayer insulating film 47 and is connected to the top end of the via 48. The interconnect 49 is electrically connected to the upper electrode 73 of the capacitor 41 via the interconnect 48. The interconnect 49 is an interconnect disposed on the uppermost layer of the interconnects provided in the semiconductor device 10.

Referring to FIG. 2, the protective film 51 is provided on the upper surface 47a of the fourth interlayer insulating film 47, so as to cover the interconnect 49 on the uppermost layer. The protective film 51 is a passivation film for the purpose of protecting the semiconductor device 10 from mechanical damage, chemical damage from chemicals and the like, and electrical damage from static electric breakdown and the like.

As the protective film 51, it is possible, for example, to use a polyimide film, a PSG film, or an $Si_3N_4$ film or the like.

According to the semiconductor device of the present embodiment, by having a gate insulating film 21 that is disposed above the gate electrode 61, a hydrogen-containing insulating film 62 covering the upper surface 61a of the gate electrode 61, and a fluorine-containing insulating film 63 burying the top part 17B of a gate electrode trench 17 with the hydrogen-containing insulating film 62 interposed therebetween, and having, on surfaces of the first and second impurity diffusion regions 65, 66 making contact with the gate insulating film 21, an Si—H bond between silicon contained in the semiconductor substrate 13 and hydrogen contained in the hydrogen-containing insulating film 62, and an Si—F bond between silicon contained in the semiconductor substrate 13 and fluorine contained in the fluorine-containing insulating film 63, because it is possible to terminate defects existing in the surfaces of first and second impurity diffusion regions 65, 66 making contact with the gate insulating film 21, it is possible to reduce the junction leakage current. Also, for example, when using a DRAM as the semiconductor device 10, it is possible to improve the refresh characteristics.

By providing, on surfaces of the first and second impurity diffusion regions 65, 66 making contact with the gate insulating film 21, a Si—F bond, which, compared with an Si—H bond, has a higher bonding energy and resists dissociation with heat, in a back-end process step after the manufacture of the semiconductor device 10 (specifically, for example, a dicing process step, a die-bonding process step, a wire-bonding process step, a semiconductor device 10 resin sealing process step, or a lead processing step), because it is possible to suppress the PBTI and NBTI failure modes and to suppress HC deterioration, it is possible to improve the reliability of transistors 25 provided in the semiconductor device 10.

In the semiconductor device 10 according to the present embodiment, a silicide layer (for example, a titanium silicide layer ($TiSi_2$ layer)) (not shown) may be provided between bottom end of the contact plug 36 and the second impurity diffusion region 66. By doing this, it possible to reduce the contact resistance between the contact plug 36 and the second impurity diffusion region 66.

FIG. 3 to FIG. 15 are cross-sectional views showing the process steps for manufacturing a semiconductor device according to the present embodiment. FIG. 3 to FIG. 15 are cross-sectional views that correspond to the cutting plane in the semiconductor device 10 shown in FIG. 2. In FIG. 3 to FIG. 15, constituent elements that are the same as in the semiconductor device 10 shown in FIG. 2 are assigned the same reference symbols.

Figure 3:
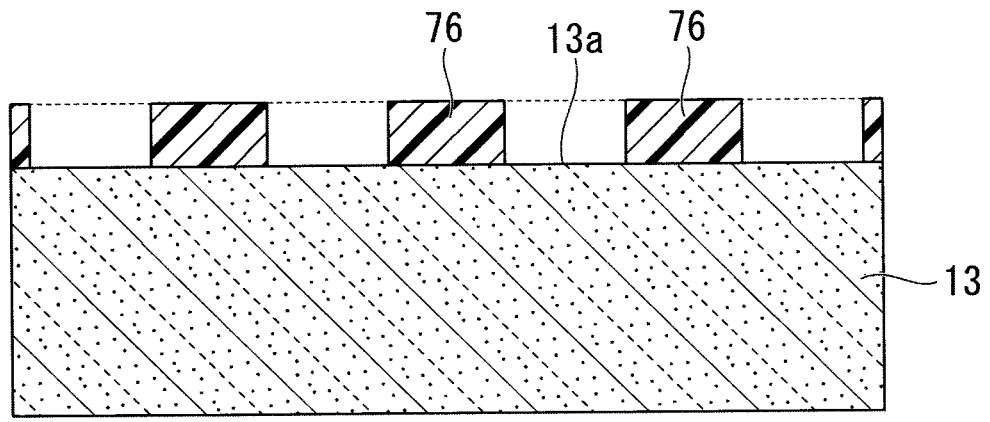
FIG. 3 is a fragmentary cross sectional elevation view of a step involved in a method of forming the semiconductor device of FIG. 2.

First, in the process step shown in FIG. 3, an element separation region 15 (refer to FIG. 1) that is not illustrated in formed on the upper surface 13a of the semiconductor substrate 13. By doing this, as shown in FIG. 1, a plurality of active regions 14 are partitioned that extend in band shapes at a prescribed angle of inclination to the X direction, and that are spaced apart by a prescribed distance in the Y direction.

A semiconductor substrate that includes silicon is prepared as the semiconductor substrate 13. Specifically, for example, a p-type single-crystal silicon substrate is prepared as the semiconductor substrate 13. In the description that follows, the case in which a p-type single-crystal silicon substrate is used as the semiconductor substrate 13 is given as an example.

The element separation region 15 is formed by the STI (shallow trench isolation) method.

Specifically, the element separation region 15 is formed by etching a trench (not shown) in the semiconductor substrate 13, and by burying an insulating film (for example, a silicon oxide film ($SiO_2$ film)) into the trench. When this is done, the element separation region 15 is formed so that the upper surface of the element separation region 15 is substantially flush with respect to the upper surface 13a of the semiconductor substrate 13.

An etching mask 76 made of a silicon nitride film (SiN film) is formed on the upper surface 13a of the semiconductor substrate 13 and the upper surface of the element separation region 15.

When this is done, the etching mask 76 (not shown in FIG. 1) is formed, in FIG. 1, into a plurality of lines (bands) that extend in band shapes in the Y direction, a plurality of which are disposed and spaced at a uniform pitch in the X direction.

Using CVD a silicon nitride film is deposited onto the upper surface 13a of the semiconductor substrate 13 and the upper surface of the element separation region 15, following which photoresist (not shown) is patterned onto the silicon nitride film using photolithography.

Next, anisotropic etching (specifically, dry etching) using the above-noted photoresist (not shown) as a mask is done to the silicon nitride film so as to form the etching mask 76 made of a silicon nitride film.

Figure 4:
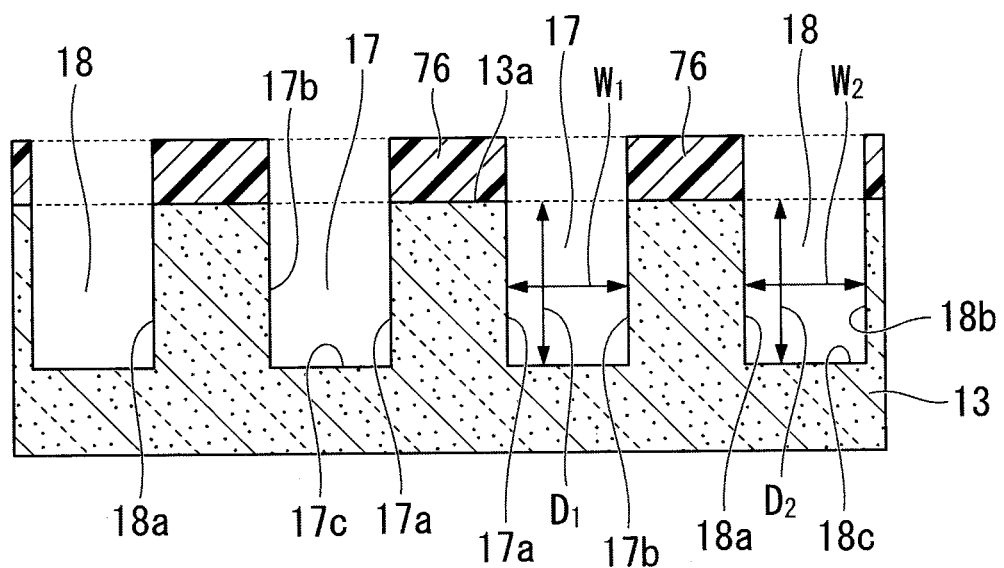
FIG. 4 is a fragmentary cross sectional elevation view of a step, subsequent to the step of FIG. 3, involved in the method of forming the semiconductor device of FIG. 2.

In the process step shown in FIG. 4, by anisotropic etching (specifically, dry etching) through the etching mask 76 so as to etch the semiconductor substrate 13 and the element separation region 15 (not shown) that are exposed from the etching mask 76, a plurality of gate electrode trenches 17 and dummy gate electrode trenches 18 are formed to extend in the Y direction shown in FIG. 1 and also to be arranged in the X direction.

When this is done, the dummy gate electrode trenches 18 are formed so as to sandwich, from the X direction, two gate electrode trenches 17 that are disposed so as to be neighboring with respect to the X direction shown in FIG. 1.

The gate electrode trenches 17 are partitioned by inner surfaces, which include the opposing side surfaces 17a, 17b and the bottom surface 17c, and the dummy electrode trenches 18 are partitioned by inner surfaces, which include the opposing side surfaces 18a, 18b and the bottom surface 18c.

By the above-noted dry etching, the width $W_1$ of the gate electrode trenches 17 is formed to be substantially the same as the width $W_2$ of the dummy gate electrode trenches 18, and the depth $D_1$ of the gate electrode trenches 17 is formed to be substantially the same as the depth $D_2$ of the dummy gate electrode trenches 18.

The widths $W_1$ and $W_2$ of the gate electrode trenches 17 and the dummy gate electrode trenches 18 can be made, for example, 45 nm. In this case, the depths $D_1$ and $D_2$ of the gate electrode trenches 17 and the dummy gate electrode trenches 18 can be made, for example, 200 nm.

Although not illustrated in the drawings, the gate electrode trenches 17 and the dummy gate electrode trenches 18 are formed so that the bottom surfaces 17c and 18c of the gate electrode trenches 17 and the dummy gate electrode trenches 18 are positioned higher than the bottom end of the element separation region 15 shown in FIG. 1.

Figure 5:
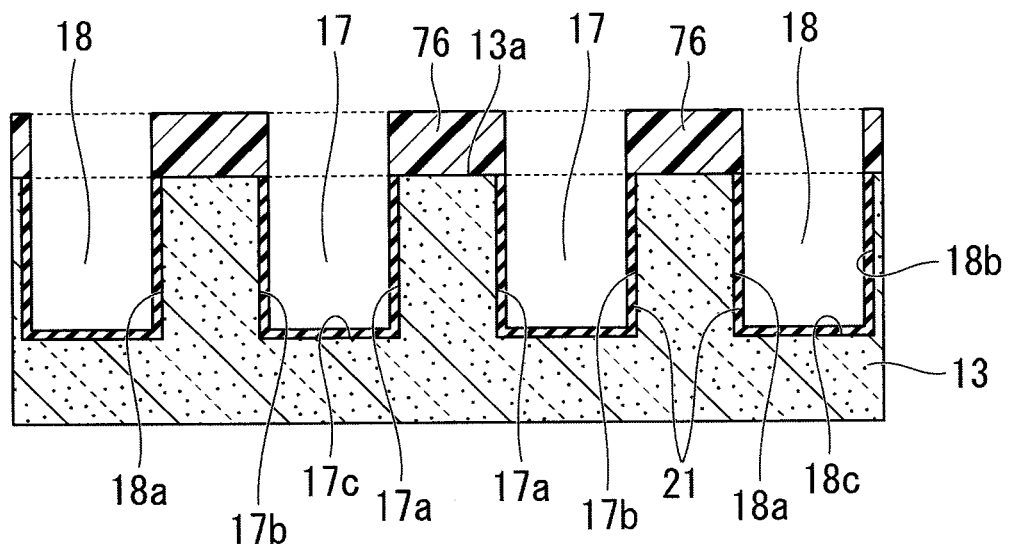
FIG. 5 is a fragmentary cross sectional elevation view of a step, subsequent to the step of FIG. 4, involved in the method of forming the semiconductor device of FIG. 2.

In the process step shown in FIG. 5, the gate insulating film 21 is formed so as to cover the inner surface of the gate electrode trenches 17 and the inner surface of the dummy gate electrode trenches 18.

As the gate insulating film 21 it is possible to use a laminated film of, for example, a single-layer silicon oxide film ($SiO_2$ film), a nitrided silicon oxide film (SiON film), a laminated silicon oxide film ($SiO_2$ film), or a silicon oxide film ($SiO_2$ film) over which a silicon nitride film (SiN film) is laminated.

In the case of using a single-layer silicon oxide film ($SiO_2$ film) as the gate insulating film 21, the gate insulating film 21 is formed by thermal oxidation. Specifically, the gate insulating film 21 made of a silicon oxide film ($SiO_2$ film) is formed in an oxidation oven having an $O_2$ atmosphere and heated to 1000° C. In the case of using a silicon oxide film ($SiO_2$ film) as the gate insulating film 21, the thickness of the gate insulating film 21 can be made, for example, 4 nm.

Figure 6:
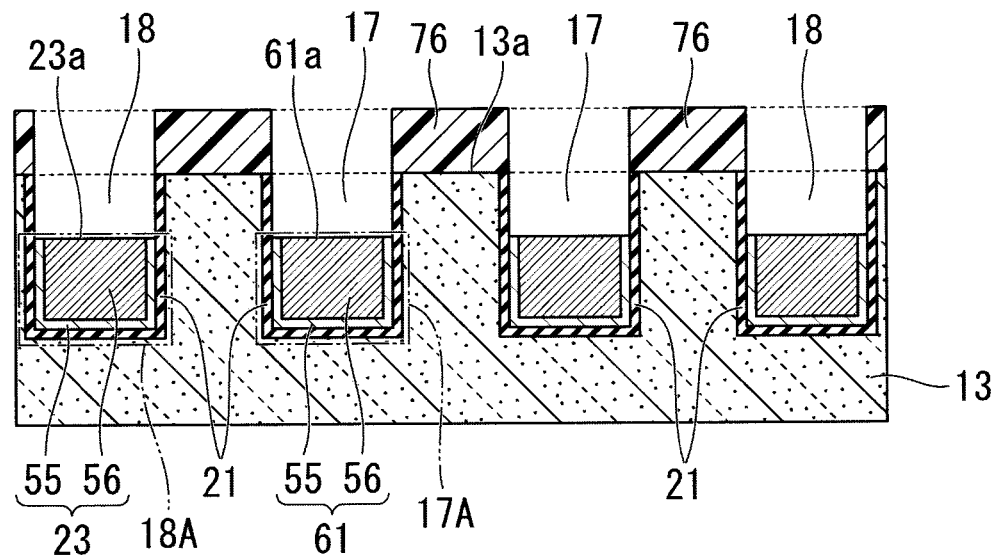
FIG. 6 is a fragmentary cross sectional elevation view of a step, subsequent to the step of FIG. 5, involved in the method of forming the semiconductor device of FIG. 2.

In the process step shown in FIG. 6, a gate electrode 61 burying the bottom part 17A of the gate electrode trench 17 with an intervening gate insulating film 21, and a dummy gate electrode 23 burying the bottom part 18A of the dummy gate electrode trench 18 are simultaneously formed.

The first metal film 55 that covers the gate insulating film 21 and the etching mask 76 is formed, and then the second metal film 56 that buries the gate electrode trench 17 and the dummy gate electrode trench 18 is formed on the surface of the first metal film 55. More specifically, a titanium nitride film (TiN film) having a thickness of 5 nm is formed as the first metal film 55, and tungsten film (W film) is formed as the second metal film 56.

By etching back the first and second metal films 55, 56 so that the first and second metal films 55, 56 remain at the bottom part 17A of the gate electrode trench 17 and at the bottom part 18A of the dummy gate electrode trench 18, the gate electrode 61 that is made of the first and second metal films 55, 56 and the dummy gate electrode 23 that is made of the first and second metal films 55, 56 are formed simultaneously. By the above-noted etching back, the upper surface 61a of the gate electrode 61 and the upper surface 23a of the dummy gate electrode 23 are disposed lower than the upper surface 13a of the semiconductor substrate 13.

Figure 7:
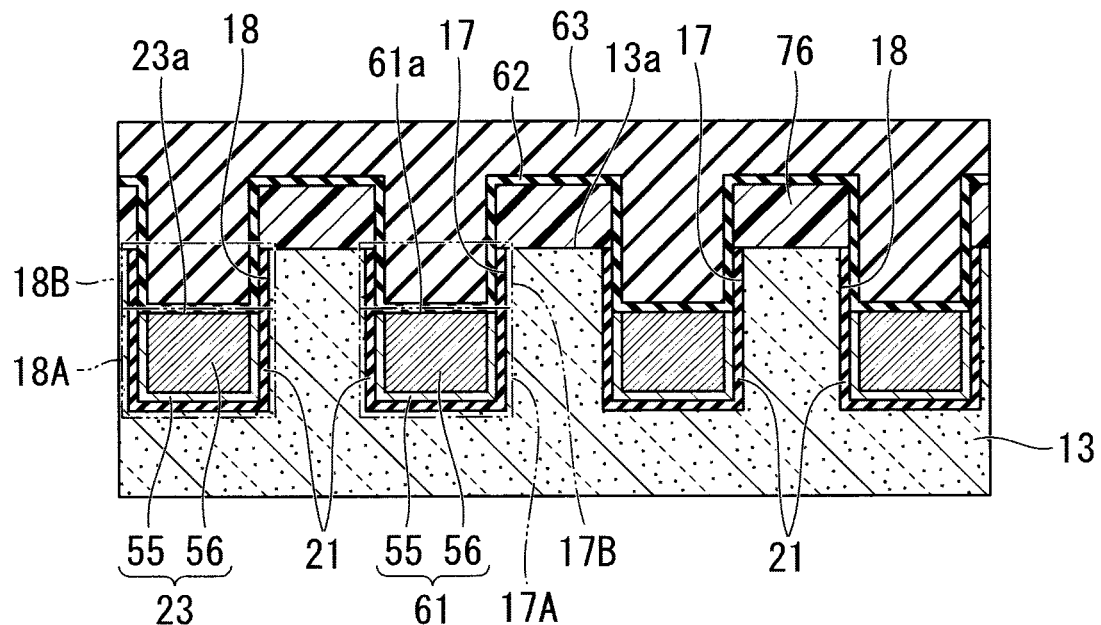
FIG. 7 is a fragmentary cross sectional elevation view of a step, subsequent to the step of FIG. 6, involved in the method of forming the semiconductor device of FIG. 2.

In the process step shown in FIG. 7, the hydrogen-containing insulating film 62 is formed that covers the upper surface 61a of the gate electrode 61, the upper surface 23a of the dummy gate electrode 23, the gate insulating film 21 that is formed higher than the gate electrode 61 and dummy gate electrode 23, and the etching mask 76.

By forming the hydrogen-containing insulating film 62 that covers the gate insulating film 21 that is formed higher than the gate electrode 61 in this manner, by thermal treatment performed in the process step shown in FIG. 12 as described later, hydrogen contained in the hydrogen-containing insulating film 62 is diffused so as to cause it to reach the surfaces of the first and second impurity diffusion regions 65, 66 that make contact with the gate insulating film 21, causing a reaction between the silicon contained in the semiconductor substrate 13 constituting the surfaces of the first and second impurity diffusion regions 65, 66 and the hydrogen contained in the hydrogen-containing insulating film 62, thereby enabling the formation of Si—H bonds.

By doing this, because it is possible to terminate defects existing at the surfaces of the first and second impurity diffusion regions 65, 66 that make contact with the gate insulating film 21, it is possible to reduce the junction leakage current. Also, in the case in which a DRAM is manufactured as the semiconductor device 10, such as in the present embodiment, it is possible to suppress a worsening of the refresh characteristics thereof.

In the process step shown in FIG. 7, plasma CVD is used to form a plasma SiN film (having a thickness, for example, of 20 nm) as the hydrogen-containing insulating film 62. It is possible to use $SiH_4$ or $NH_3$ or the like as the gas uses when forming the plasma SiN film. In this case, a processing temperature (deposition temperature) of, for example, 300° C. can be used.

By using plasma CVD in this manner to form the hydrogen-containing insulating film 62, because the plasma is rich in hydrogen (H), in comparison to a case in which ALD (atomic layer deposition) or LP-CVD is used to form the hydrogen-containing insulating film 62, it is possible to make the hydrogen concentration contained in the hydrogen-containing insulating film 62 higher.

Also, formation should be done so that the hydrogen contained in the plasma SiN film that becomes the hydrogen-containing insulating film 62 has a concentration in the range from 0.5 to $2 \times 10^{22}$ atoms/cm$^3$. If the hydrogen concentration is lower than $0.5 \times 10^{22}$ atoms/cm$^3$, the termination effect is insufficient, and if it exceeds $2 \times 10^{22}$ atoms/cm$^3$, the hydrogen within the film coheses and becomes a gas, and the application of thermal processing at 400° C. or above is particularly undesirable because it leads expansion and breakage of the film.

The fluorine-containing insulating film 63 is formed that buries the top part 17B of the gate electrode trench 17 and the top part 18B of the dummy gate electrode trench 18 (the positioned higher than the bottom part 18A of the dummy gate electrode trench 18), with the hydrogen-containing insulating film 62 intervening therebetween. When this is done, as shown in FIG. 7, the flouring-containing insulating film 63 covers the etching mask 76 and the depressions formed in the etching mask 76.

A HDP-CVD (high-density plasma CVD) method is used to form an SiOF film as the fluorine-containing insulating film 63.

When this is done, the fluorine contained in the fluorine-containing insulating film 63 should have a concentration in the range, for example, from 0.5 to $1 \times 10^{21}$ atoms/cm$^3$. If the concentration is below this range, the termination effect is insufficient, and if it is excessive, there is a risk of the gate electrode being etched.

SiOF or NF$_3$ or the like can be used as the gas when forming the SiOF film by HDP-CVD. In this case, a processing temperature (deposition temperature) of, for example, 300° C. can be used.

By forming the fluorine-containing insulating film 63 so as to cover the gate insulating film 21 that is formed above the gate electrode 61 and the dummy gate electrode 23 in this manner with the hydrogen-containing insulating film 62 intervening therebetween, by thermal treatment performed in the process step shown in FIG. 12 as described later, fluorine contained in the fluorine-containing insulating film 63 is diffused so as to cause it to reach the surfaces of the first and second impurity diffusion regions 65, 66 that make contact with the gate insulating film 21, causing a reaction between the silicon contained in the semiconductor substrate 13 constituting the surfaces of the first and second impurity diffusion regions 65, 66 and the fluorine contained in the fluorine-containing insulating film 63, thereby enabling the formation of Si—F bonds.

By doing this, because it is possible to terminate defects existing at the surfaces of the first and second impurity diffusion regions 65, 66 that make contact with the gate insulating film 21, it is possible to reduce the junction leakage current. Also, in the case in which a DRAM is manufactured as the semiconductor device 10, such as in the present embodiment, it is possible to suppress a worsening of the refresh characteristics.

As described above, because an Si—F bond has a higher bonding energy than an Si—H bond, it is difficult to dissociate with the application of stress or heat to the semiconductor device 10.

Thus, in a back-end process step (specifically, for example, a dicing process step, a die-bonding process step, a wire-bonding process step, a process step of sealing the semiconductor device 10 with resin, or a lead processing step), because it is possible to suppress the PBTI and NBTI failure modes and to suppress HC deterioration, it is possible to improve the reliability of transistors 25 (refer to FIG. 9) provided in the semiconductor device 10 that are formed in back-end process steps.

By forming the fluorine-containing insulating film 63 over the gate electrode 61 and over the dummy gate electrode 23 with the hydrogen-containing insulating film 62 intervening therebetween, direct contact between the fluorine-containing insulating film 63 and a metal film constituting the gate electrode 61 and the dummy gate electrode 23 (specifically, the first and the second metal films 55, 56) is eliminated, so that the fluorine contained in the fluorine-containing insulating film 63 enables suppression of the corrosion of the metal film that constitutes the gate electrode 61 and the dummy gate electrode 23.

Figure 8:
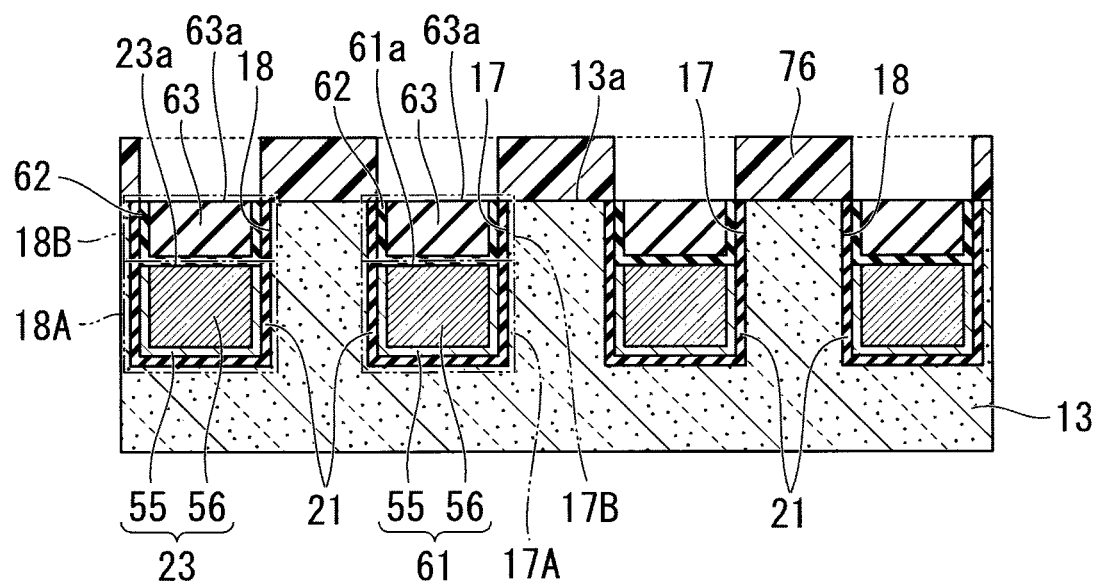
FIG. 8 is a fragmentary cross sectional elevation view of a step, subsequent to the step of FIG. 7, involved in the method of forming the semiconductor device of FIG. 2.

In the process step shown in FIG. 8, by etching back the hydrogen-containing insulating film 62 and the fluorine-containing insulating film 63 shown in FIG. 7, the hydrogen-containing insulating film 62 and the fluorine-containing insulating film 63 remain on the top part 17B of the gate electrode trench 17 and the top part 18B of the dummy gate electrode trench 18.

When this is done, the above-noted etching back is done so that the upper surface 63a of the fluorine-containing insulating film 63 is substantially flush with respect the upper surface 13a of the semiconductor substrate 13. By doing this, the hydrogen-containing insulating film 62 and the fluorine-containing insulating film 63 having the shapes shown in FIG. 2 are formed.

Figure 9:
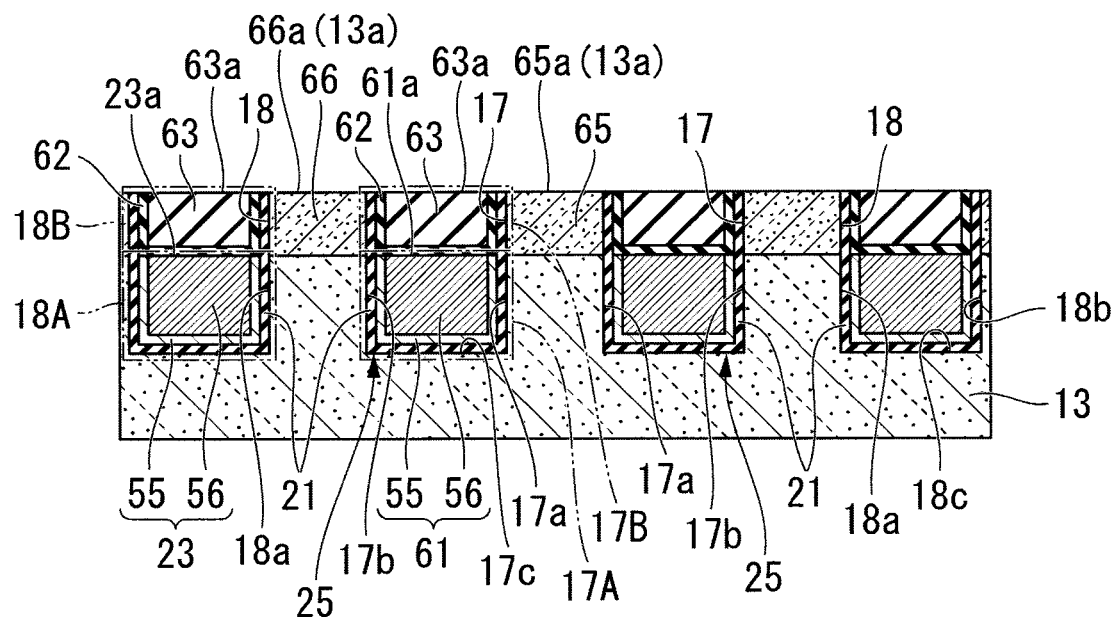
FIG. 9 is a fragmentary cross sectional elevation view of a step, subsequent to the step of FIG. 8, involved in the method of forming the semiconductor device of FIG. 2.

In the process step shown in FIG. 9, the etching mask 76 shown in FIG. 8 is removed, thereby exposing the upper surface 13a of the semiconductor substrate 13.

The first impurity diffusion region 65 that makes contact with the gate insulating film 21 formed on the first side surface 17a and the second impurity diffusion region 66 that makes contact with the gate insulating film 21 formed on the second side surface 17b are formed simultaneously on the semiconductor substrate 13 positioned higher than the gate electrode 61.

By doing this, the first impurity diffusion region 65 is formed on the semiconductor substrate 13 positioned between first side walls 17a, and the second impurity diffusion region 66 is formed on the semiconductor substrate 13 positioned between the second side wall 17b and the side wall 18a.

In the case in which the semiconductor substrate 13 is a p-type silicon substrate, by ion implanting phosphorus (P), which is an n-type impurity, into the semiconductor substrate 13, the first and second impurity diffusion regions 65, 66 are formed. By doing this, a transistor 25 is formed that has the gate insulating film 21, the gate electrode 61, the first impurity diffusion region 65, and the second impurity diffusion region 66.

When forming the above-noted first and second impurity diffusion regions 65, 66, the lower surfaces of the first and second impurity diffusion regions 65, 66 are made to substantially coincide with the upper surface 61a of the gate electrode 61.

Because the first and second impurity diffusion regions 65, 66 are formed by ion implantation of an n-type impurity into the upper surface 13a of the semiconductor substrate 13, the upper surfaces 65a, 66a of the first and second impurity diffusion regions 65, 66 is made substantially flush with respect to the upper surface 13a of the semiconductor substrate 13.

Figure 10:
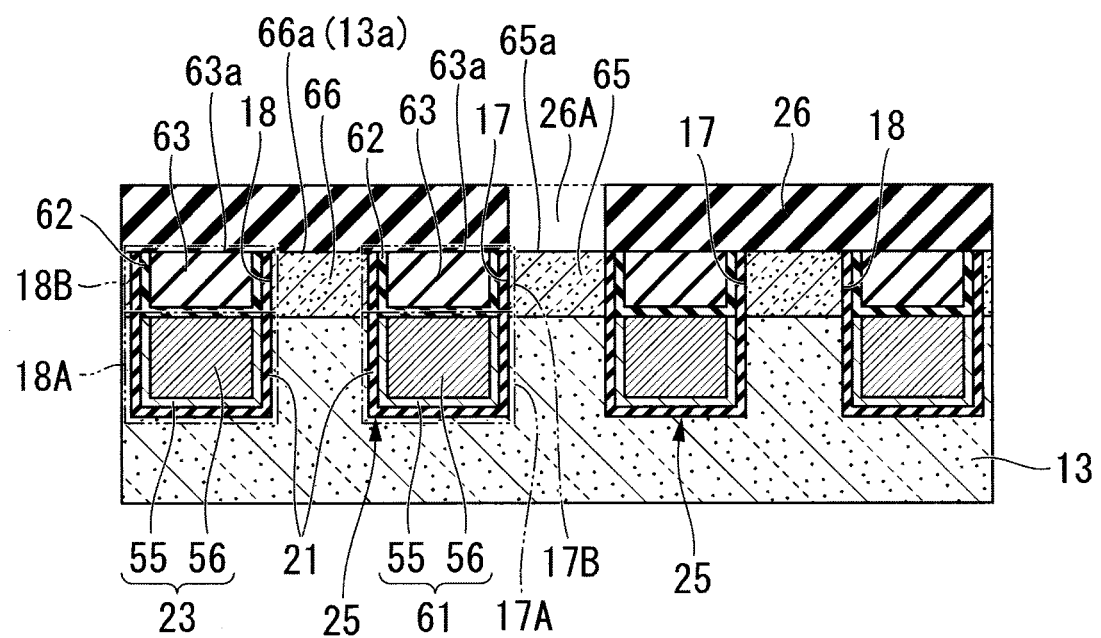
FIG. 10 is a fragmentary cross sectional elevation view of a step, subsequent to the step of FIG. 9, involved in the method of forming the semiconductor device of FIG. 2.

In the process step shown in FIG. 10, the first interlayer insulating film 26 is formed so as to cover the top end surface of the gate insulating film 21, the top end surface of the hydrogen-containing insulating film 62, the upper surface 63a of the fluorine-containing insulating film 63, and the upper surface 66a of the second impurity diffusion region 66, and so as to have a trench-shaped aperture part 26A that exposes the upper surface 65a of the first impurity diffusion region 65.

A silicon oxide film (SiO$_2$ film) that covers the upper surface of the structure shown in FIG. 9 is formed by CVD, followed by the use of photolithography and dry etching to form the aperture part 26A the exposes the upper surface 65a of the first impurity diffusion region 65 in the silicon oxide film (SiO$_2$ film), so as to form a first interlayer insulating film 26 made of a silicon oxide film (SiO$_2$ film).

Figure 11:
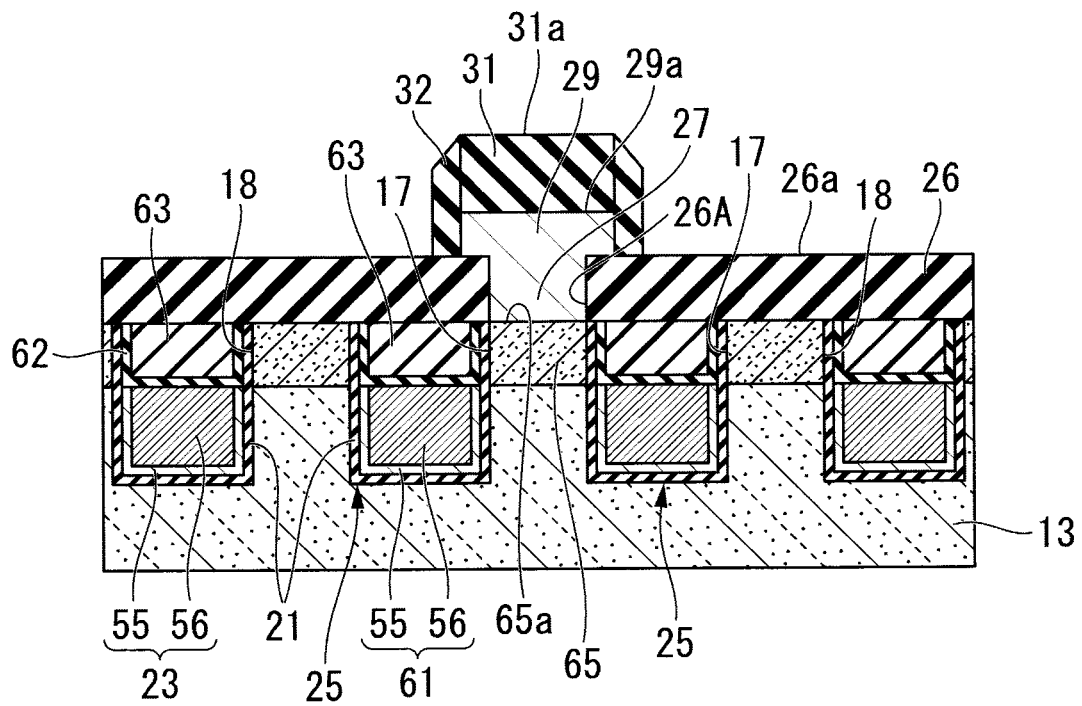
FIG. 11 is a fragmentary cross sectional elevation view of a step, subsequent to the step of FIG. 10, involved in the method of forming the semiconductor device of FIG. 2.

In the process step shown in FIG. 11, the aperture part 26A is filled, and the bit contact 27 that makes contact with the upper surface 65a of the first impurity diffusion region 65, the bit line 29 that is integrated with the bit contact 27, and the capacitor insulating film 31 that covers the upper surface 29a of the bit line 29 are formed simultaneously.

A conductive film (not shown) made of a base material that is the bit contact 27 and the bit line 29 is formed so as to fill the aperture part 26A and cover the upper surface 26a of the first interlayer insulating film 26, followed by deposition onto the conductive film of a non-illustrated silicon nitride film (SiN film) that serves as the base material of the capacitor insulating film 31.

Next, photolithography and dry etching are used to pattern the silicon nitride film (SiN film) and the conductive film, so as to form the capacitor insulating film 31, the bit contact 27, and the bit line 29 that is integrated with the bit contact 27 simultaneously.

As the conductive film that is the base material of the bit contact 27 and the bit line 29, it is possible to use a laminated film in which, for example, a polysilicon film, a titanium nitride film (TiN film) and a tungsten film (W film) are successively laminated. In this case, the polysilicon film is formed to a thickness that buries the aperture part 26A.

A silicon nitride film (SiN film, not shown) and a silicon oxide film (SiO$_2$ film, not shown) are successively formed, so as to cover the side surface of the bit line 29 and the capacitor insulating film 31. After that, by etching the entire surface of the silicon nitride film (SiN film) and the silicon oxide film (SiO$_2$ film), a side wall film 32 is formed that covers the side surface of the capacitor insulating film 31 and the side surface of the bit line 29, and also that is made of a silicon nitride film (SiN film) and a silicon oxide film (SiO$_2$).

By the laminated formation of the side wall film 32 by the lamination of a silicon nitride film (SiN film) and a silicon oxide film (SiO$_2$) in this manner, in the process step shown in FIG. 12, to be described later, in the case of forming a coated insulating film by SOG (spin-on-glass) as the second interlayer insulating film 33, because the wettability of the coated insulating film is improved, it is possible to suppress the occurrence of voids inside the coated insulating film.

Figure 12:
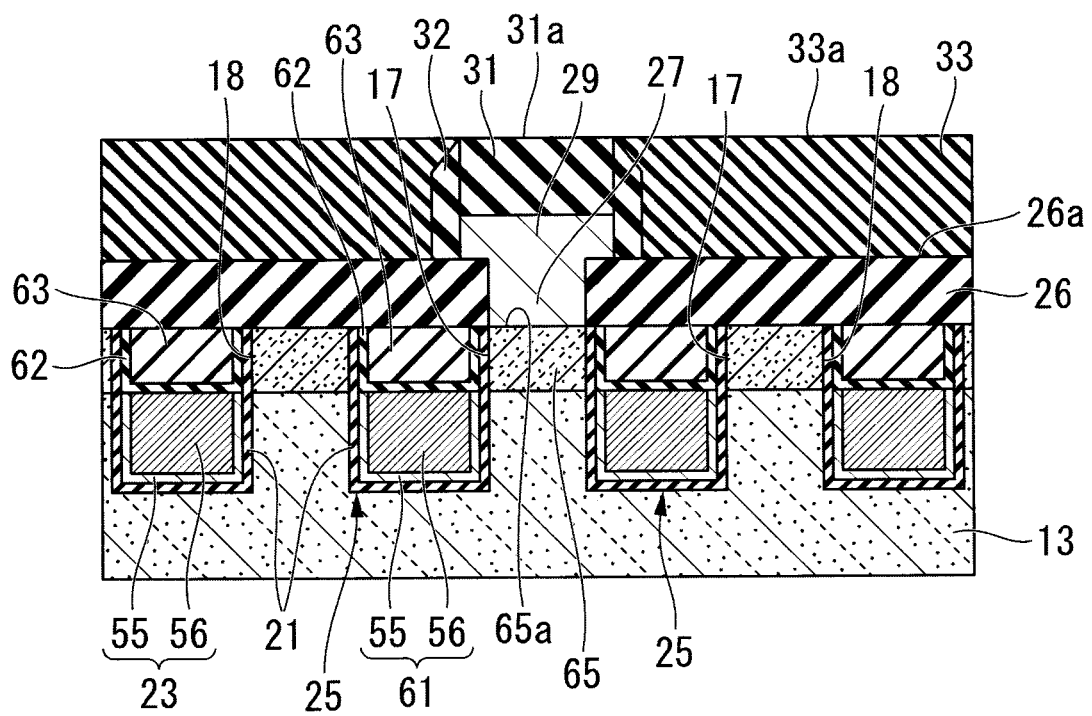
FIG. 12 is a fragmentary cross sectional elevation view of a step, subsequent to the step of FIG. 11, involved in the method of forming the semiconductor device of FIG. 2.

In the process step shown in FIG. 12, the second interlayer insulating film 33 that has an upper surface 33a that is substantially flush with respect to the upper surface 31a of the capacitor insulating film 31 is formed on the upper surface side of the structure shown in FIG. 11. By doing this, the upper surface 31a of the capacitor insulating film 31 is exposed from the second interlayer insulating film 33.

A coated insulating film (silicon oxide film) that becomes the base material of the second interlayer insulating film 33 is spun onto the upper surface side of the structure shown in FIG. 11 using SOG, so as to cover the capacitor insulating film 31 and the side wall film 32. When forming the above-noted coated insulating film, a coated liquid that contains polysilizane can be used.

By performing thermal treatment, the hydrogen contained in the hydrogen-containing insulating film 62 and the fluorine contained in the fluorine-containing insulating film 63 are caused to diffuse, so that the film quality of the coated insulating film is densely packed and also that they reach the surfaces of the first and second impurity diffusion regions 65, 66 that make contact with the gate insulating film 21.

By doing this, the silicon contained in the semiconductor substrate 13 that constitutes the surfaces of the first and second impurity diffusion regions 65, 66 and the diffused hydrogen react, resulting in the formation of Si—H bonds, and the silicon contained in the semiconductor substrate 13 that constitutes the surfaces of the first and second impurity diffusion regions 65, 66 and the diffused fluorine react, resulting in the formation of Si—F bonds.

By doing this, as described above, it is not only possible to reduce the leakage current, but also possible to improve the reliability of the transistor 25.

In the above-noted thermal treatment, it is possible to use conditions, for example, of a temperature of 700 to 800° C., and a processing time of 10 minutes. The thermal treatment can be performed in steam atmosphere.

The thermal treatment process step for causing diffusion of the hydrogen contained in the hydrogen-containing insulating film 62 and the fluorine contained in the fluorine-containing insulating film 63 can be performed as a process step subsequent to the process step of forming the bit line 29.

In this manner, by performing the thermal treatment process step for the purpose of causing diffusion of the hydrogen contained in the hydrogen-containing insulating film 62 and the fluorine contained in the fluorine-containing insulating film 63 as a process step subsequent to the process step of forming the bit line 29, it is possible to sufficiently terminate defects that exist at the surfaces of the first and second impurity diffusion regions 65, 66 making contact with the gate insulating film 21 and that are caused by damage by dry etching, stress caused by processing and deposition, and defects caused by ion implantation and the like.

Although the present embodiment has been described for an example in which thermal treatment is used when forming the second interlayer insulating film 33 so as to cause diffusion of the hydrogen contained in the hydrogen-containing insulating film 62 and the fluorine contained in the fluorine-containing insulating film 63, it is sufficient that the thermal treatment to cause diffusion of the hydrogen and the fluorine be subsequent to the formation of the bit line 29, and there is no restriction to the present embodiment.

A CMP method is used to polish the thermally treated coated insulating film (silicon oxide film) until the upper surface 31a of the capacitor insulating film 31 is exposed. By doing this, as shown in FIG. 12, a second interlayer insulating film 33 that has a flat upper surface 33a and that also is made of a coated insulating film (silicon oxide film) is formed.

Although it is not illustrated in FIG. 12, after polishing CVD may be used to form a silicon oxide film (SiO$_2$ film) that covers the upper surface 31a of the capacitor insulating film 31 and the upper surface 33a of the second interlayer insulating film 33.

Figure 13:
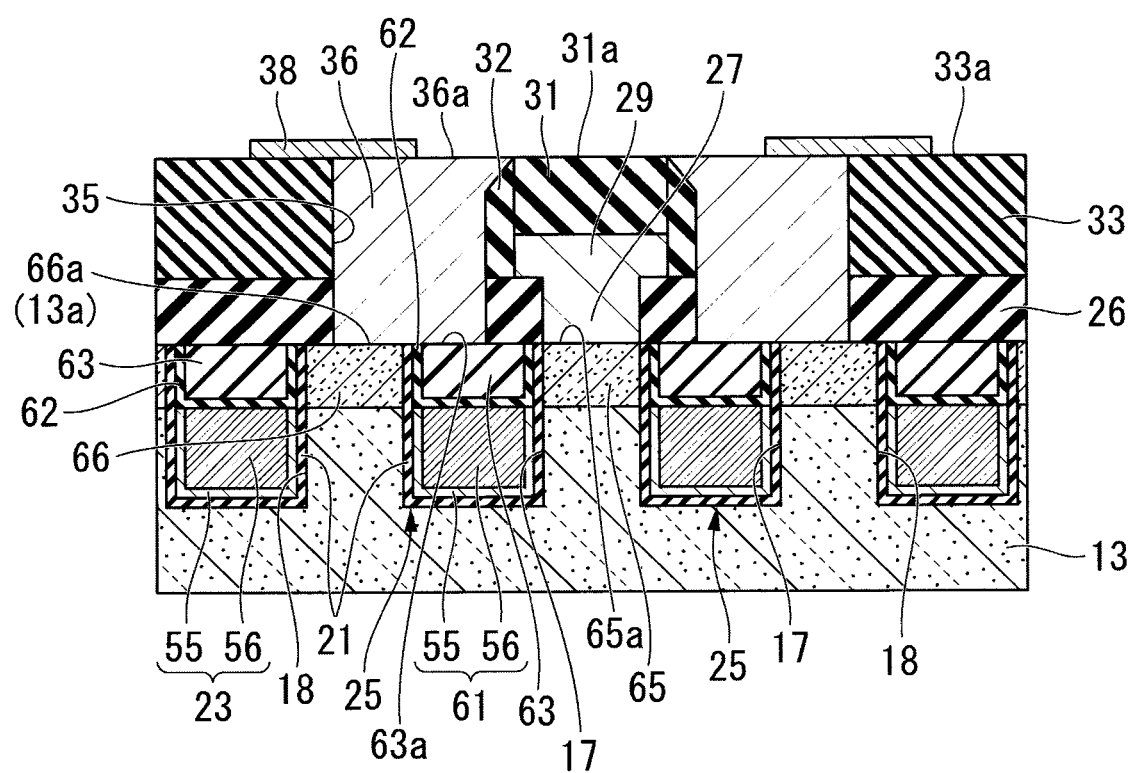
FIG. 13 is a fragmentary cross sectional elevation view of a step, subsequent to the step of FIG. 12, involved in the method of forming the semiconductor device of FIG. 2.

In the process step shown in FIG. 13, a SAC (self-alignment contact) is used to perform anisotropic etching (specifically, dry etch) of the first and second interlayer insulating films 26, 33 and to form the contact hole 35 that passes through the first and second interlayer insulating films 26, 33 and that also reaches a part of the upper surface 66a of the second impurity diffusion region 66 and a part of the upper surface of the fluorine-containing insulating film 63.

A CVD method is used to perform successive lamination of a titanium nitride film (not shown) and a tungsten film (not shown), so as to bury the inside of the contact hole 35.

A CMP method is used to polish and remove the unnecessary titanium nitride film and tungsten film that are formed on the upper surface 33a of the second interlayer insulating film 33, so as to form the contact plug 36, that is made of the titanium nitride film and tungsten film and that has an upper surface 36a that is flush with respect to the upper surface 33a of the second interlayer insulating film 33. By doing this, the contact plug 36 makes contact with the upper surface 66a of the second impurity diffusion region 66 so as to be electrically connected to the second impurity diffusion region 66.

The capacitor contact pad 38 making contact with a part of the upper surface 36a of the contact plug 36 is formed on the upper surface 33a of the second interlayer insulating film 33.

A metal film (not shown) that becomes the base material of the contact plug 36 is deposited so as to cover the upper surface 31a of the capacitor insulating film 31, the upper surface 36a of the contact plug 36, and the upper surface 33a of the second interlayer insulating film 33.

Photolithography is used to form photoresist (not shown) covering a surface corresponding to the formation region of the capacitor contact pad 38 of the upper surface of the metal film. The unnecessary metal film exposed from the photoresist is removed by dry etching, with the photoresist as a mask, thereby forming the capacitor contact pad 38 that is made of the metal film. After that, the photoresist (not shown) is removed.

Figure 14:
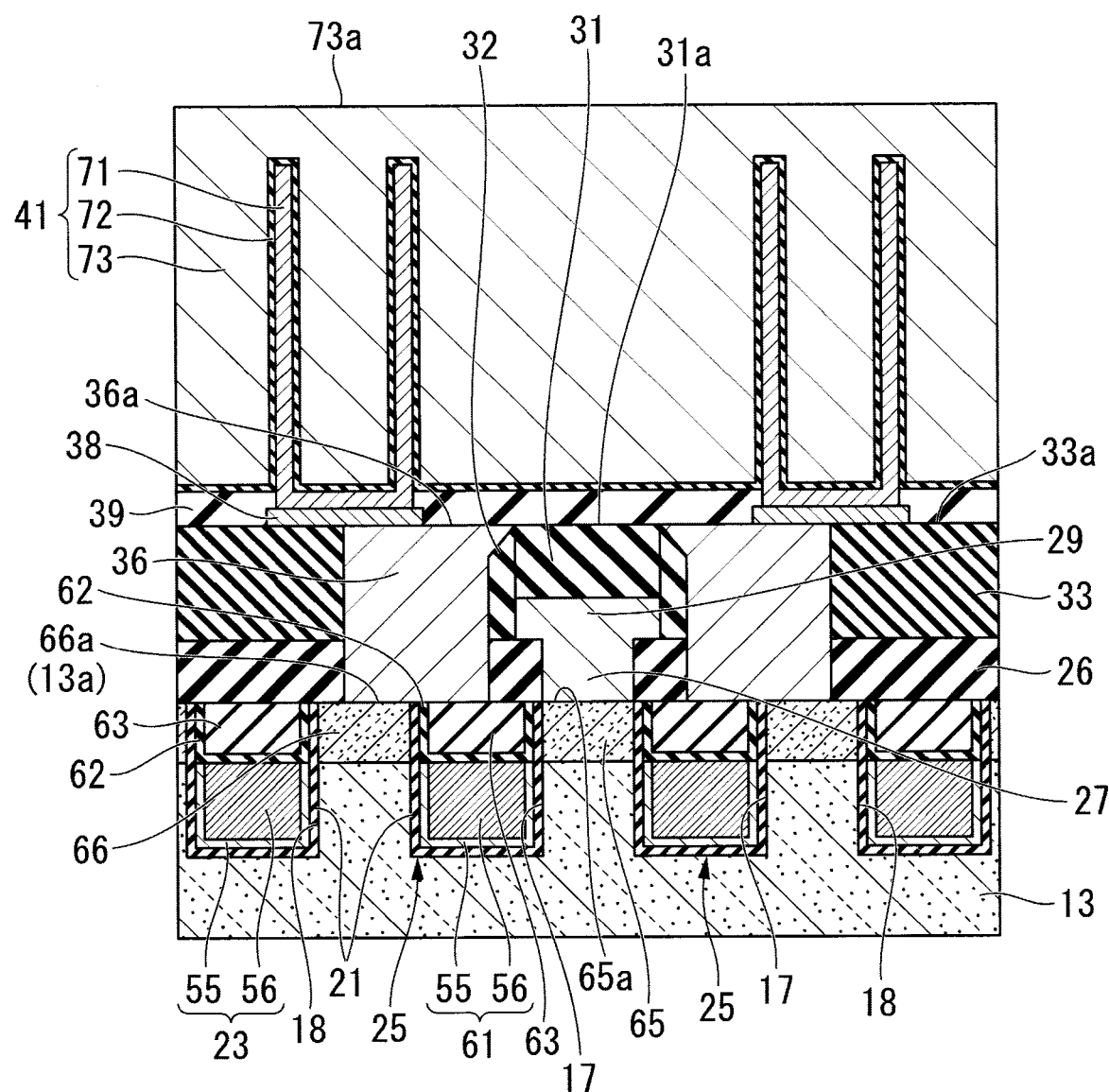
FIG. 14 is a fragmentary cross sectional elevation view of a step, subsequent to the step of FIG. 13, involved in the method of forming the semiconductor device of FIG. 2.

In the process step shown in FIG. 14, the silicon nitride film 39 covering the capacitor contact pad 38 is formed over the upper surface 31a of the capacitor insulating film 31, the upper surface 36a of the contact plug 36, and the upper surface 33a of the second interlayer insulating film 33.

Because there is a need for the silicon nitride film 39 to function as a stopper with respect to etching of the silicon oxide film, it is necessary to have a densely packed film formed by thermal CVD, which does not use plasma.

Specifically, the above-noted silicon nitride film 39 is formed with a raw gas of dichlorosilane and ammonia at a temperature range of 650 to 800° C. This formation is done so that the amount of hydrogen included within the silicon nitride film 39 is within the range from 1 to $2 \times 10^{21}$ atoms/cm$^3$.

The silicon nitride film 39 that is within the range of the above-noted concentration does not function as hydrogen to terminate the inner surface of the gate electrode trench 17. On the contrary, because the silicon nitride film 39 that is densely packed functions rather as a diffusion barrier for the hydrogen that is supplied from the gas state in the final hydrogen annealing, it is a factor in inhibiting the diffusion of hydrogen up to the gate insulating film 21.

Next, a thick silicon oxide film (SiO$_2$ film) having a thickness, which is not shown in drawing, is deposited onto the silicon nitride film 39. The thickness of the silicon oxide film (SiO$_2$ film) can be made, for example, 1,500 nm.

Photolithography is used to form photoresist (not shown) that is patterned onto a silicon oxide film (SiO$_2$ film). Next, a silicon oxide film (not shown) opposing the capacitor contact pad 38, and the silicon nitride film 39 are etched by dry etching, using the photoresist as a mask, thereby forming a cylinder hole (not shown) exposing the capacitor contact pad 38. After that, the photoresist (not shown) is removed.

A metal film (for example, a titanium nitride film) is deposed on the inner surface of the cylinder hole (not shown) and the upper surface of the capacitor contact pad 38 to form the lower electrode 71, that is made from the metal film and that has the shape of a crown.

Wet etching is performed to remove the silicon oxide film (not shown). The upper surface of the silicon nitride film 39 is exposed. When this is done, the silicon nitride film 39 functions as an etching-prevention film that prevents the structure that is formed beneath the silicon nitride film 39 from being etched.

The capacitor insulating film 72, which covers the upper surface of the silicon nitride film 39 and the lower electrode 71, is formed. The upper electrode 73 is formed, which buries the inside of the lower electrode 71 in which the capacitor insulating film 72 is formed, and buries between a plurality of the lower electrodes 71, so as to cover the surface of the capacitor insulating film 72.

When this is done, the upper electrode 73 is formed so that the position of the upper surface 73a thereof is disposed higher than the capacitor insulating film 72. By doing this, a capacitor 41 made of the lower electrode 71, the capacitor insulating film 72, and the upper electrode 73 having the flat upper surface 73a is formed onto each of the capacitor contact pads 38.

Figure 15:
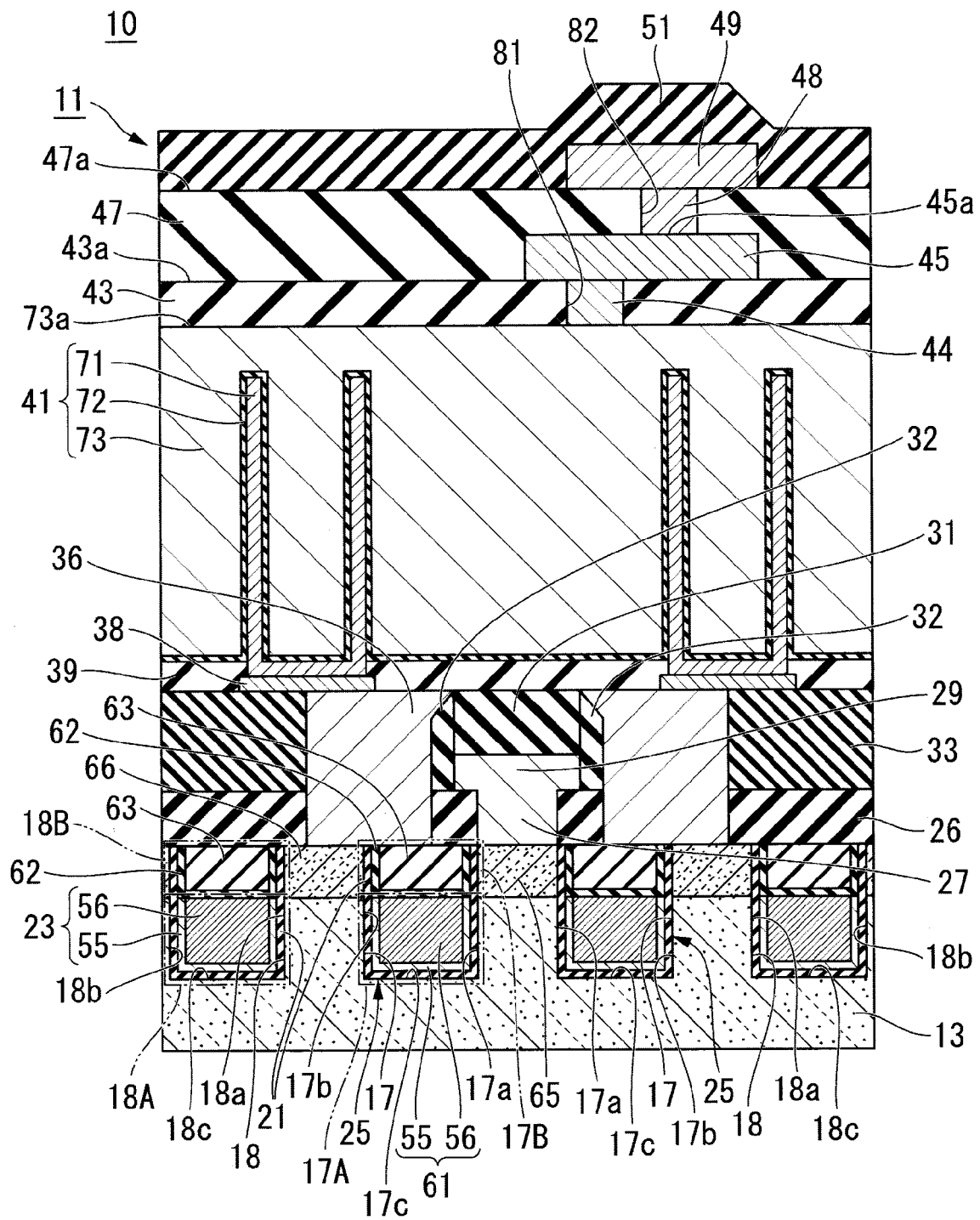
FIG. 15 is a fragmentary cross sectional elevation view of a step, subsequent to the step of FIG. 14, involved in the method of forming the semiconductor device of FIG. 2.

In the process step shown in FIG. 15, the third interlayer insulating film 43 that covers the upper surface 73a of the upper electrode 73 is formed. Specifically, CVD is used to form a silicon oxide film (SiO$_2$ film) so as to form the third interlayer insulating film 43 made of the silicon oxide film (SiO$_2$ film).

Photolithography and dry etching are used to form an aperture part 81 that exposes the upper surface 73a of the upper electrode 73, in the third interlayer insulating film 43.

A metal film (not shown) that buries the aperture part 81 is formed on the upper surface 43a of the third interlayer insulating film 43.

Photolithography and dry etching are used to pattern the metal film, thereby simultaneously forming the via 44 that is made from the metal film and that is contacted to the upper surface 73a of the upper electrode 73 and the interconnect 45 that is made from the metal film and that is integrally formed with the via 44. By doing this, the interconnect 45 is electrically connected to the upper electrode 73 through the via 44.

The fourth interlayer insulating film 47 that covers the interconnect 45 is formed on the upper surface 43a of the third interlayer insulating film 43. Specifically, CVD is used to form a silicon oxide film (SiO$_2$ film), thereby forming the fourth interlayer insulating film 47 made from the silicon oxide film (SiO$_2$ film).

In the same manner as the formation of the aperture part 81, which is described above, by etching the fourth interlayer insulating film 47, an aperture part 82 exposing the upper surface 45a of the interconnect 45 is formed.

In the same manner as the formation of the via 44 and the interconnect 45, which is described above, by burying the aperture part 82, the via 48 connected to the upper surface 45a of the interconnect 45 and the interconnect 49 formed integrally with the via 48 on the upper surface 47a of the fourth interlayer insulating film 47 are simultaneously formed. By doing this, the interconnect 49 is electrically connected to the upper electrode 73 through the via 48.

After the above, the protective film 51 that covers the uppermost layer interconnect 49 is formed on the upper surface 47a of the fourth interlayer insulating film 47. Specifically, for example, a polyimide film, a PSG film, an Si$_3$N$_4$ film, or the like is formed as the protective film 51. By doing this, as shown in FIG. 15, the semiconductor device 10 according to the present embodiment is manufactured.

According to the method for manufacturing semiconductor device of the present embodiment, by including a process step of forming the gate insulating film 21 formed above the gate electrode 61 and the hydrogen-containing insulating film 62 covering the upper surface 61a of the gate electrode 61, a process step for forming the fluorine-containing insulating film 63 burying the top part 17B of the gate electrode trench 17 with the hydrogen-containing insulating film 62 interposed therebetween, and a process step for forming an Si—H bond and an Si—F bond at the surfaces of the first and second impurity diffusion regions 65, 66 making contact with the gate insulating film 21, by diffusing hydrogen contained in the hydrogen-containing insulating film 62, and fluorine contained in the fluorine-containing insulating film 63 by thermal treatment of the semiconductor substrate 13 that includes silicon, because the Si—H bond and the Si—F bond enable termination of defects existing at the surfaces of the first and second impurity diffusion regions 65, 66 making contact with the gate insulating film 21, it is possible to reduce the junction leakage current.

Thus, in the case in which, such as in the present embodiment, a DRAM is used as the semiconductor device 10, it is possible to suppress a worsening of the refresh characteristics By forming Si—F bonds having a higher bonding force than that of Si—H bonds at the surfaces of the first and second impurity diffusion regions 65, 66 making contact with the gate insulating film 21, in the semiconductor device 10 that has been subjected to back-end processing, because it is possible to suppress the PBTI and the NBTI failure modes, and HC deterioration, it is possible to improve the reliability of transistors 25.

A silicide layer (for example, a titanium silicide layer (TiSi$_2$ layer)), which is not shown in drawings, may be formed between the lower end of the contact plug 36 and the second impurity diffusion region 66.

By doing this, the contact resistance between the contact plug 36 and the second impurity diffusion region 66 can be reduced.

Although preferred embodiments of the present invention have been described above, the present invention is not limited to the specific embodiments, and various modifications and changes are possible, within the spirit of the present invention described in the claims.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a semiconductor substrate including silicon and having a groove;
   a gate insulator covering inside surfaces of the groove;
   a first diffusion region in the substrate, the first diffusion region having a first contact surface that contacts the gate insulator;
   a gate electrode on the gate insulator and in the groove;
   a hydrogen-containing insulator over the gate electrode and in the groove, the hydrogen-containing insulator being adjacent to the gate insulator; and
   a fluorine-containing insulator on the hydrogen-containing insulator and in the groove,
   wherein the first contact surface includes Si—H bonds.

2. The semiconductor device according to claim 1, wherein the semiconductor substrate comprises a silicon substrate and the first contact surface includes Si—F bonds.

3. The semiconductor device according to claim 1, wherein the hydrogen-containing insulator comprises a hydrogen-containing plasma silicon nitride film.

4. The semiconductor device according to claim 1, wherein the fluorine-containing insulator comprises a fluorine-containing silicon oxide film.

5. The semiconductor device according to claim 1, wherein the gate electrode comprises:
   a first metal film as a barrier metal that contacts the gate insulator; and
   a second metal film on the first metal film, the second metal film being lower in resistivity than the first metal film.

6. The semiconductor device according to claim 1, wherein the semiconductor substrate includes an active region and an isolation region which defines the active region, and the groove extends across the isolation region.

7. The semiconductor device according to claim 1, further comprising:
   a bit line coupled to the first diffusion region.

8. The semiconductor device according to claim 1, further comprising:
   a second diffusion region in the substrate, the second diffusion region having a second contact surface that contacts the gate insulator, the second diffusion region being placed in an opposite side of the groove to the first diffusion region;
   wherein the second contact surface includes Si—H bonds and Si—F bonds.

9. The semiconductor device according to claim 8, further comprising:
   a contact plug coupled to the second diffusion region; and
   a capacitor coupled to the contact plug.

10. The semiconductor device according to claim 9, further comprising:
    a capacitive contact pad on an upper surface of the contact plug, the capacitor being disposed on the capacitive contact pad.

11. The semiconductor device according to claim 9, further comprising:
    an inter-layer insulator in which the capacitor is provided; and
    a multi-layered insulator over the inter-layer insulator, the multi-layered insulator comprising a silicon nitride film.

12. A semiconductor device comprising:
    an insulator;
    a silicon region having a contact surface that contacts the insulator;

a hydrogen-containing insulator being adjacent to the insulator, the hydrogen-containing insulator being disposed in an opposite side of the insulator to the silicon region; and a fluorine-containing insulator being adjacent to the hydrogen-containing insulator, the fluorine-containing insulator being disposed in an opposite side of the hydrogen-containing insulator to the insulator, wherein the contact surface includes Si—H bonds.

13. The semiconductor device according to claim 12, wherein the hydrogen-containing insulator comprises a hydrogen-containing plasma silicon nitride film.

14. The semiconductor device according to claim 12, wherein the fluorine-containing insulator comprises a fluorine-containing silicon oxide film.

15. The semiconductor device according to claim 12, wherein the insulator includes at least one of silicon oxide, silicon nitride and silicon oxynitride and the contact surface includes Si—F bonds.

16. A semiconductor device comprising:
a silicon substrate having a groove, the semiconductor device including an active region and an isolation region which defines the active region, and the groove extending across the isolation region;
a gate insulator covering bottom and side surfaces of the groove;
a first diffusion region formed in the silicon substrate, the first diffusion region having a first contact surface that contacts the gate insulator;
a second diffusion region formed in the silicon substrate, the second diffusion region being positioned in an opposite side of the groove to the first diffusion region, the second diffusion region having a second contact surface that contacts the gate insulator;
a gate electrode formed on the gate insulator and in the groove;
a hydrogen-containing insulator formed over the gate electrode and in the groove, the hydrogen-containing insulator extending along the gate insulator that covers the side surfaces; and
a fluorine-containing insulator formed on the hydrogen-containing insulator and in the groove,
wherein each of the first and second contact surfaces includes Si—H bonds.

17. The semiconductor device according to claim 16, wherein each of the first and second contact surfaces includes Si—F bonds.

18. The semiconductor device according to claim 17, further comprising:
a contact plug coupled to the second diffusion region; and
a capacitor coupled to the contact plug.

19. The semiconductor device according to claim 18, further comprising:
a capacitive contact pad on an upper surface of the contact plug, the capacitor being disposed on the capacitive contact pad.

20. The semiconductor device according to claim 19, further comprising:
an inter-layer insulator in which the capacitor is provided; and
a multi-layered insulator over the inter-layer insulator, the multi-layered insulator comprising a silicon nitride film.

* * * * *